(12) United States Patent
Bellmann et al.

(10) Patent No.: US 6,699,597 B2
(45) Date of Patent: Mar. 2, 2004

(54) METHOD AND MATERIALS FOR PATTERNING OF AN AMORPHOUS, NON-POLYMERIC, ORGANIC MATRIX WITH ELECTRICALLY ACTIVE MATERIAL DISPOSED THEREIN

(75) Inventors: Erika Bellmann, St. Paul, MN (US); James G. Bentsen, North St. Paul, MN (US); Yong Hsu, Woodbury, MN (US); Nirmal Manoj, St. Paul, MN (US); Martin B. Wolk, Woodbury, MN (US)

(73) Assignee: 3M Innovative Properties Company, St. Paul, MN (US)

( * ) Notice: Subject to any disclaimer, the term of this patent is extended or adjusted under 35 U.S.C. 154(b) by 0 days.

(21) Appl. No.: 09/931,598

(22) Filed: Aug. 16, 2001

(65) Prior Publication Data

US 2003/0068525 A1 Apr. 10, 2003

(51) Int. Cl.[7] .................. H05B 33/14; H05B 33/10; B32B 9/00
(52) U.S. Cl. .................. 428/690; 428/917; 313/504; 313/506
(58) Field of Search .................. 313/504, 502, 313/506, 509; 428/690, 917; 427/66, 146, 402

(56) References Cited

U.S. PATENT DOCUMENTS

| | | | |
|---|---|---|---|
| 4,252,671 A | 2/1981 | Smith | 252/430 |
| 5,166,024 A | 11/1992 | Bugner et al. | 430/70 |
| 5,256,506 A | 10/1993 | Ellis et al. | 430/20 |
| 5,281,489 A | * 1/1994 | Mori et al. | 428/690 |
| 5,351,617 A | 10/1994 | Williams et al. | 101/467 |
| 5,621,131 A | 4/1997 | Kreuder et al. | 558/46 |
| 5,693,446 A | 12/1997 | Staral et al. | 430/201 |
| 5,695,907 A | 12/1997 | Chang | 430/201 |
| 5,708,130 A | 1/1998 | Woo et al. | 528/397 |
| 5,710,097 A | 1/1998 | Staral et al. | 503/227 |

(List continued on next page.)

FOREIGN PATENT DOCUMENTS

| | | | |
|---|---|---|---|
| EP | 0 851 714 A2 | 7/1998 | |
| EP | 1 003 354 A1 | 5/2000 | |
| EP | 1 146 574 | 10/2001 | |
| JP | 2000-195673 | 7/2000 | ........... H05B/33/20 |
| WO | WO 98/55561 | 12/1998 | ........... C09K/11/06 |
| WO | WO 99/21935 | 5/1999 | ........... C09K/11/06 |
| WO | WO 99/40655 | 8/1999 | ........... H01S/3/16 |
| WO | WO 00/03565 | 1/2000 | ........... H05B/33/00 |
| WO | WO 00/18851 | 4/2000 | ........... C09K/11/06 |
| WO | WO 00/41894 | 7/2000 | |
| WO | WO 00/70655 | 11/2000 | |
| WO | WO 01/83410 | 11/2001 | ........... C07C/15/50 |

OTHER PUBLICATIONS

Contoret et al., The Photopolymerization and Cross–Linking of Electroluminescent Liquid Crystals Containing Methacrylate and Diene Photopolymerizable End Groups for Multilayer Organic Light–Emitting Diodes, *Chem. Mater.*, vol. 14, pp. 1477–1487 (2002).

(List continued on next page.)

*Primary Examiner*—Cynthia H. Kelly
*Assistant Examiner*—Dawn Garrett

(57) ABSTRACT

In one method of making an organic electroluminescent device, a transfer layer is solution coated on a donor substrate. The transfer layer includes an amorphous, non-polymeric, organic matrix with a light emitting material disposed in the matrix. The transfer layer is then selectively patterned on a receptor. Examples of patterning methods include laser thermal transfer or thermal head transfer. The method and associated materials can be used to form, for example, organic electroluminescent devices.

7 Claims, 3 Drawing Sheets

U.S. PATENT DOCUMENTS

| | | | | |
|---|---|---|---|---|
| 5,725,989 | A | 3/1998 | Chang et al. | 430/201 |
| 5,728,801 | A | 3/1998 | Wu et al. | 528/422 |
| 5,840,217 | A | 11/1998 | Lupo et al. | 252/583 |
| 5,869,350 | A | 2/1999 | Heeger et al. | 438/29 |
| 5,900,327 | A | 5/1999 | Pei et al. | 428/690 |
| 5,929,194 | A | 7/1999 | Woo et al. | 528/229 |
| 5,998,085 | A | 12/1999 | Isberg et al. | 430/200 |
| 6,030,715 | A | 2/2000 | Thompson et al. | 428/690 |
| 6,114,088 | A | 9/2000 | Wolk et al. | 430/273.1 |
| 6,132,641 | A | 10/2000 | Rietz et al. | 252/301.16 |
| 6,150,043 | A | 11/2000 | Thompson et al. | 428/690 |
| 6,169,163 | B1 | 1/2001 | Woo et al. | 528/397 |
| 6,194,119 | B1 | 2/2001 | Wolk et al. | 430/200 |
| 6,214,520 | B1 | 4/2001 | Wolk et al. | 430/273.1 |
| 6,221,543 | B1 | 4/2001 | Guehler et al. | 430/7 |
| 6,221,553 | B1 | 4/2001 | Wolk et al. | 430/200 |
| 6,228,543 | B1 | 5/2001 | Mizuno et al. | 430/17 |
| 6,228,555 | B1 | 5/2001 | Hoffend, Jr. et al. | 430/200 |
| 6,242,115 | B1 | 6/2001 | Thomson et al. | 428/690 |
| 6,242,152 | B1 | 6/2001 | Staral et al. | 430/201 |
| 6,284,425 | B1 | 9/2001 | Staral et al. | 430/201 |
| 6,416,887 | B1 * | 7/2002 | Tokito et al. | 428/690 |

OTHER PUBLICATIONS

Roitman et al., "Polymer Thermosetting Organic Light–Emitting Devices," *IEEE J. of Selected Topics in Quantum Electronics*, vol. 4, No. 1, pp. 58–66 (1998).

Baldo, M.A., et al., "Highly efficient phosphorescent emission from organic electroluminescent devices," *Nature*, vol. 395, pp. 151–154 (Sep. 10, 1998).

Baldo, et al., "Phosphorescent materials for application to organic light emitting devices", *Pure Appl. Chem.* Vol 71, No. 11, pp. 2095–2106 (1999).

Chen, et al., "Recent Developments in Molecular Organic Electroluminescent Materials"*Macromol. Symp.* 125, pp. 1–48 (1997).

Friend, et al., "Electroluminescence in Conjugated Polymers" *Nature*, vol. 397, (1999), pp. 121–128.

Fujikawa, et al., "Energy structures of triphyenylamine oligomers", *Synthetic Metals*, 91, p. 161–162 (1997).

Grazulevicius, et al., "Charge–Transporting Polymers and Molecular Glasses", *Handbook of Advanced Electronic and Photonic Materials and Devices*, H.S. Nalwa (ed.), 10, pp. 233–274 (2001).

Kim, et al., "Novel fluorine–based polymers containing acetylene units", *Synthetic Metals*, 119 (2001) pp. 105–106.

Kraft, et al., "Electroluminescent Conjugated Polymers–13 Seeing Polymers in a New Light", *Angew. Chem. Int. Ed.*, 37, pp. 402–428 (1998).

Kreger et al., "Novel starshaped molecules based on fluorine", *Synthetic Metals*, 119, pp. 163–165 (2001).

Robinson et al., "Electroluminescence from Well–Defined Tetrahedral Oligophenylenevinylene Tetramers", *Adv. Mat.*, (2000), 12(22), p. 1701–1704.

Sainova, et al., "Control of color and efficiency of light–emitting diodes based on polyfluorenes blended with hole–transporting molecules", *Applied Physics Letters*, vol. 76, No. 14, pp. 1810–1812 (2000).

Shirota, "Organic materials for electronic and optoelectronic devices", *J. Mater. Chem.*, 10, pp. 1–25, (2000).

Tanaka, et al., "Preparation of hyperbranched copolymers constituted of triphenylamine and phyenylene units", *Synthetic Metals*, 119 (2001) pp. 139–140.

Tang, et al., "Electroluminescence of doped organic thin films", *J. Appl. Phys.*, vol. 65, No. 9, (1989) pp. 3610–3616.

* cited by examiner

US 6,699,597 B2

METHOD AND MATERIALS FOR PATTERNING OF AN AMORPHOUS, NON-POLYMERIC, ORGANIC MATRIX WITH ELECTRICALLY ACTIVE MATERIAL DISPOSED THEREIN

BACKGROUND

Pattern-wise thermal transfer of materials from donor sheets to receptor substrates has been proposed for a wide variety of applications. For example, materials can be selectively thermally transferred to form elements useful in electronic displays and other devices. Specifically, selective thermal transfer of color filters, black matrix, spacers, polarizers, conductive layers, transistors, phosphors, and organic electroluminescent materials have all been proposed.

SUMMARY OF THE INVENTION

The present invention is directed to materials and methods for patterning an amorphous, non-polymeric, organic matrix with electrically active material disposed in the matrix, as well as the devices formed using the materials and methods. One embodiment of the invention includes a method of making an organic electroluminescent device. A transfer layer is solution coated on a donor substrate. The transfer layer includes an amorphous, non-polymeric, organic matrix with a light emitting material disposed in the matrix. The transfer layer is then selectively thermally transferred to a receptor. Thermal transfer can include laser thermal transfer or thermal head transfer.

Another embodiment is a donor sheet that includes a substrate and a transfer layer. The transfer layer includes a solution-coated, amorphous, non-polymeric, organic matrix with a light emitting material disposed in the matrix. This transfer layer is capable of being selectively thermally transferred from the donor sheet to a proximally located receptor. Optionally, the donor sheet also includes a light-to-heat conversion layer disposed on the substrate for converting incident imaging radiation into heat.

Yet another embodiment is a method of making a donor sheet. The method includes forming a transfer layer on a substrate by solution coating a coating composition on the substrate to form an amorphous, non-polymeric, organic matrix with a light emitting material disposed in the matrix. Optionally, the method also includes forming a light-to-heat conversion layer on the substrate.

Another embodiment is an electroluminescent device that includes a first electrode, a second electrode, and a light emitting layer disposed between the first and second electrodes. The light emitting layer includes an amorphous, non-polymeric organic matrix with a light emitting polymer disposed in the matrix. Such devices include, for example, single OEL devices for, for example, lighting applications and pixelated devices, such as displays, which contain multiple OEL devices.

It will be recognized that electrically active materials other than light emitting materials can be disposed in an amorphous, non-polymeric, organic matrix. For example, a conducting or semiconducting material can be disposed in the amorphous, non-polymeric, organic matrix. Application examples include the formation of a hole transport layer or electron transport layer or other charge conducting layer by disposing a hole transport material or electron transport material in an amorphous, non-polymeric, organic matrix. The matrix can be formed using, for example, any of the materials described above. This structure can be particularly useful for conducting or semiconducting polymeric materials to produce a layer with lower cohesive strength than the polymer itself.

In addition, these materials and methods can also be useful for non-thermal printing and transfer methods including, for example, inkjet printing, screen printing, and photolithographic patterning.

BRIEF DESCRIPTION OF THE DRAWINGS

The invention may be more completely understood in consideration of the following detailed description of various embodiments of the invention in connection with the accompanying drawings, in which.

Figure 1:
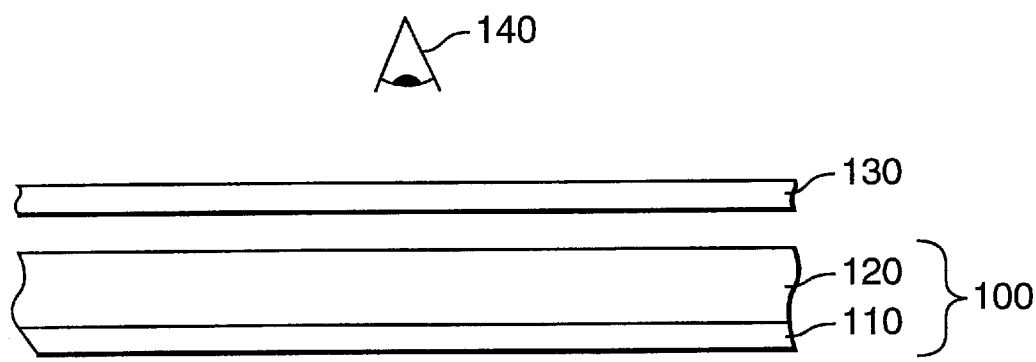
FIG. 1 is a schematic side view of an organic electroluminescent display construction.

While the invention is amenable to various modifications and alternative forms, specifics thereof have been shown by way of example in the drawings and will be described in detail. It should be understood, however, that the intention is not to limit the invention to the particular embodiments described. On the contrary, the intention is to cover all modifications, equivalents, and alternatives falling within the spirit and scope of the invention.

DETAILED DESCRIPTION

The present invention contemplates materials and methods for the thermal patterning of an amorphous, non-polymeric, organic matrix with an electrically active material disposed therein. Such methods and materials can be used to form devices including organic electronic devices and displays that include electrically active organic materials, and in particular that contain light emitting polymers or other light emitting molecules. Examples of organic electronic devices that can be made include organic transistors, photovoltaic devices, organic electroluminescent (OEL) devices such as organic light emitting diodes (OLEDs), and the like. In addition, these materials and methods can also be useful for non-thermal printing, patterning, and transfer methods including, for example, inkjet printing, screen printing, and photolithographic patterning.

The terms "active" or "electrically active", when used to refer to a layer or material in an organic electronic device, indicate layers or materials that perform a function during operation of the device, for example producing, conducting, or semiconducting a charge carrier (e.g., electrons or holes), producing light, enhancing or tuning the electronic properties of the device construction, and the like. The term "non-active" refers to materials or layers that, although not directly contributing to functions as described above, may have some non-direct contribution to the assembly or fabrication or to the functionality of an organic electronic device.

Organic electroluminescent (OEL) display or device refers to electroluminescent displays or devices that include an organic emissive material, whether that emissive material includes a small molecule (SM) emitter, a SM doped polymer, a light emitting polymer (LEP), a doped LEP, a blended LEP, or another organic emissive material whether provided alone or in combination with any other organic or inorganic materials that are functional or non-functional in the OEL display or devices R. H. Friend, et al. ("Electroluminescence in Conjugated Polymers" Nature, 397, 1999, 121.), incorporated herein by reference, describe one mechanism of electroluminescence as including the "injection of electrons from one electrode and holes from the other, the capture of oppositely charged carriers (so-called recombination), and the radiative decay of the excited electron-hole state (exciton) produced by this recombination process."

Materials for OEL devices can be small molecule (SM) or polymeric in nature. SM materials include charge transporting, charge blocking, semiconducting, and electroluminescent organic and organometallic compounds. Generally, SM materials can be vacuum deposited or evaporated to form thin layers in a device. In practice, multiple layers of SMs are typically used to produce efficient OELs since a given material generally does not have both the desired charge transport and electroluminescent properties.

LEP materials are typically conjugated polymeric or oligomeric molecules that preferably have sufficient film-forming properties for solution processing. Conventionally, LEP materials are utilized by casting a solvent solution of the LEP material on a substrate, and evaporating the solvent, thereby leaving a polymeric film. Other methods for forming LEP films include ink jetting and extrusion coating. Alternatively, LEPs can be formed in situ on a substrate by reaction of precursor species. Efficient LEP lamps have been constructed with one, two, or more organic layers.

OELs can also be fabricated with one or more molecular glasses. Molecular glass is the term used to describe organic, low molar mass, amorphous, film-forming compounds. Hole transporting, electron transporting, and bipolar molecular glasses are known including those described in J. V. Grazulevicius, P. Strohriegl, "Charge-Transporting Polymers and Molecular Glasses", *Handbook of Advanced Electronic and Photonic Materials and Devices*, H. S. Nalwa (ed.),10, 2001, 233, incorporated herein by reference. The solubility of the molecular glasses can limit the ways in which multilayer electronic structures are conventionally created. For example, it may not be possible to solution coat a light emitting polymer layer on top of a hole transport layer of a molecular glass if the materials of the two layers are soluble in the same solvents. Devices have been previously formed with, for example, solution coated hole transport layers and vapor deposited emission and electron transport layers.

As an example of device structure, FIG. 1 illustrates an OEL display or device 100 that includes a device layer 110 and a substrate 120. Any other suitable display component can also be included with display 100. Optionally, additional optical elements or other devices suitable for use with electronic displays, devices, or lamps can be provided between display 100 and viewer position 140 as indicated by optional element 130.

In some embodiments like the one shown, device layer 110 includes one or more OEL devices that emit light through the substrate toward a viewer position 140. The viewer position 140 is used generically to indicate an intended destination for the emitted light whether it be an actual human observer, a screen, an optical component, an electronic device, or the like. In other embodiments (not shown), device layer 110 is positioned between substrate 120 and the viewer position 140. The device configuration shown in FIG. 1 (termed "bottom emitting") may be used when substrate 120 is transmissive to light emitted by device layer 110 and when a transparent conductive electrode is disposed in the device between the emissive layer of the device and the substrate. The inverted configuration (termed "top emitting") may be used when substrate 120 does or does not transmit the light emitted by the device layer and the electrode disposed between the substrate and the light emitting layer of the device does not transmit the light emitted by the device.

Device layer 110 can include one or more OEL devices arranged in any suitable manner. For example, in lamp applications (e.g., backlights for liquid crystal display (LCD) modules), device layer 110 might constitute a single OEL device that spans an entire intended backlight area. Alternatively, in other lamp applications, device layer 110 might constitute a plurality of closely spaced devices that can be contemporaneously activated. For example, relatively small and closely spaced red, green, and blue light emitters can be patterned between common electrodes so that device layer 110 appears to emit white light when the emitters are activated. Other arrangements for backlight applications are also contemplated.

In direct view or other display applications, it may be desirable for device layer 110 to include a plurality of independently addressable OEL devices that emit the same or different colors. Each device might represent a separate pixel or a separate sub-pixel of a pixilated display (e.g., high resolution display), a separate segment or sub-segment of a segmented display (e.g., low information content display), or a separate icon, portion of an icon, or lamp for an icon (e.g., indicator applications).

In at least some instances, an OEL device includes a thin layer, or layers, of one or more suitable organic materials sandwiched between a cathode and an anode. When activated, electrons are injected into the organic layer(s) from the cathode and holes are injected into the organic layer(s) from the anode. As the injected charges migrate towards the oppositely charged electrodes, they may recombine to form electron-hole pairs which are typically referred to as excitons. The region of the device in which the exitons are generally formed can be referred to as the recombination zone. These excitons, or excited state species, can emit energy in the form of light as they decay back to a ground state.

Other layers can also be present in OEL devices such as hole transport layers, electron transport layers, hole injection layer, electron injection layers, hole blocking layers, electron blocking layers, buffer layers, and the like. In addition, photoluminescent materials can be present in the electroluminescent or other layers in OEL devices, for example, to convert the color of light emitted by the electroluminescent material to another color. These and other such layers and materials can be used to alter or tune the electronic properties and behavior of the layered OEL device, for example to achieve a desired current/voltage response, a desired device efficiency, a desired color, a desired brightness, and the like.

FIGS. 4A to 4F illustrate examples of different OEL device configurations. Each configuration includes a substrate 250, an anode 252, and a cathode 254. The configurations of FIGS. 4C to 4F also include a hole transport layer 258 and the configurations of FIGS. 4B and 4D to 4F include an electron transport layer 260. These layers conduct holes from the anode or electrons from the cathode, respectively. Each configuration also includes a light emitting layer 256a, 256b, 256c that includes one or more light emitting polymers or other light emitting molecules (e.g., small molecule light emitting compounds) disposed in an amorphous, non-polymeric, organic matrix, according to the invention. The light emitting layer 256a includes a hole transport material, the light emitting layer 256b includes an electron transport material, and the light emitting layer 256c includes both hole transport material and electron transport material. In some embodiments, the hole transport material or electron transport material is a material that forms the amorphous, non-polymeric, organic matrix which contains the light emitting polymer or other light emitting molecules. In other embodiments, a separate matrix-forming material is used. In addition, the hole transport material or electron transport material in the light emitting layer 256a, 256b, 256c can be the same as or different from the material used in the hole transport layer 258 or electron transport layer 260, respectively.

The anode 252 and cathode 254 are typically formed using conducting materials such as metals, alloys, metallic compounds, metal oxides, conductive ceramics, conductive dispersions, and conductive polymers, including, for example, gold, platinum, palladium, aluminum, calcium, titanium, titanium nitride, indium tin oxide (ITO), fluorine tin oxide (FTO), and polyaniline. The anode 252 and the cathode 254 can be single layers of conducting materials or they can include multiple layers. For example, an anode or a cathode may include a layer of aluminum and a layer of gold, a layer of calcium and a layer of aluminum, a layer of aluminum and a layer of lithium fluoride, or a metal layer and a conductive organic layer.

The hole transport layer 258 facilitates the injection of holes from the anode into the device and their migration towards the recombination zone. The hole transport layer 258 can further act as a barrier for the passage of electrons to the anode 252. The hole transport layer 258 can include, for example, a diamine derivative, such as N,N'-bis(3-methylphenyl)-N,N'-bis(phenyl)benzidine (also known as TPD) or N,N'-bis(3-naphthalen-2-yl)-N,N'-bis(phenyl) benzidine (NPB), or a triarylamine derivative, such as, 4,4',4"-Tris(N,N-diphenylamino)triphenylamine (TDATA) or 4,4',4"-Tris(N-3-methylphenyl-N-phenylamino) triphenylamine (mTDATA). Other examples include copper phthalocyanine (CuPC); 1,3,5-Tris(4-diphenylaminophenyl) benzenes (TDAPBs); and other compounds such as those described in H. Fujikawa, et al., *Synthetic Metals,* 91, 161 (1997) and J. V. Grazulevicius, P. Strohriegl, "Charge-Transporting Polymers and Molecular Glasses", *Handbook of Advanced Electronic and Photonic Materials and Devices,* H. S. Nalwa (ed.), 10, 233–274 (2001), both of which are incorporated herein by reference.

The electron transport layer 260 facilitates the injection of electrons and their migration towards the recombination zone. The electron transport layer 260 can further act as a barrier for the passage of holes to the cathode 254, if desired. As an example, the electron transport layer 260 can be formed using the organometallic compound tris(8-hydroxyquinolato)aluminum (Alq3). Other examples of electron transport materials include 1,3-bis[5-(4-(1,1-dimethylethyl)phenyl)-1,3,4-oxadiazol-2-yl]benzene, 2-(biphenyl-4-yl)-5-(4-(1,1-dimethylethyl)phenyl)-1,3,4-oxadiazole (tBuPBD) and other compounds described in C. H. Chen, et al., *Macromol. Symp.* 125, 1 (1997) and J. V. Grazulevicius, P. Strohriegl, "Charge-Transporting Polymers and Molecular Glasses", *Handbook of Advanced Electronic and Photonic Materials and Devices,* H. S. Nalwa (ed.),10, 233 (2001), both of which are incorporated herein by reference.

A number of methods have been used or tried to make OEL devices. For example, SM light emitting devices have been formed by sequential vapor deposition of hole transporting, emitting, and electron transporting molecules. Although the layers are amorphous when deposited, the layers can crystallize over time, diminishing their charge transport and emission properties. In general, it can be difficult to solution cast SM materials since they tend to form crystallites upon solvent drying or later during the device lifetime.

As another example, light emitting layers based on LEP materials have been fabricated by solution coating a thin layer of the polymer. This method may be suitable for monochromatic displays or lamps. In the case of devices fabricated with solution casting steps, it is much more difficult to create multilayer devices by multiple solvent casting steps. Multilayer devices could be produced in which layers are cast from different solvents, a first insoluble layer is created in situ and a second layer is solvent cast, a first layer is solution cast and a second layer is vapor deposited, or one or both of the layers is crosslinked.

Polymer dispersed small molecule devices have been fabricated by solution casting a blend of a host polymer (e.g. polyvinylcarbazole) and a mixture of one or more small molecule dopants. In general, these devices require high voltages to operate and are not suitable for display applications. In addition, they suffer from the same restrictions for patterning as the LEPs.

Another method of forming devices includes the transfer of one or more transfer layers by laser thermal patterning as described in, for example, U.S. Pat. Nos. 6,242,152; 6,228,555; 6,228,543; 6,221,553; 6,221,543; 6,214,520; 6,194,119; 6,114,088; 5,998,085; 5,725,989; 5,710,097; 5,695,907; and 5,693,446, and in co-assigned U.S. patent application Ser. Nos. 09/853,062; 09/844,695; 09/844,100; 09/662,980; 09/662,845; 09/473,114; and 09/451,984, all of which are incorporated herein by reference. The patterning process can depend upon the physical properties of the transfer layer. One parameter is the cohesive, or film strength, of the transfer layer. During imaging, the transfer layer preferably breaks cleanly along the line dividing imaged and unimaged regions to form the edge of a pattern. Highly conjugated polymers which exist in extended chain conformations, such as polyphenylenevinylenes, can have high tensile strengths and elastic moduli comparable to that of polyaramide fibers. In practice, clean edge formation during the laser thermal imaging of light emitting polymers can be challenging. The undesired consequence of poor edge formation is rough, torn, or ragged edges on the transferred pattern.

As an alternative to or improvement on these previous methods and to address some of the above-described difficulties, light emitting material, such as one or more light emitting polymers (LEPs) or other light emitting molecules, can be solution coated as part of a coating composition that includes a material capable of forming an amorphous, non-polymeric, organic matrix that resists crystallization. The amorphous nature of the matrix can, in combination with the non-polymeric nature of the matrix, provide low cohesive strength, as compared to typical polymer transfer layers, during transfer from a donor medium to a receptor, as described below. The amorphous nature of the matrix-forming material may also act to compatibilize more than one electrically active material (e.g. two otherwise incompatible LEPs or an LEP and a phosphorescent emitter). LEPs will be used as an example for the description below, but it will be recognized that other light emitting, semiconducting, hole transporting, electron transporting, or otherwise electrically active molecules could be used in place of or in addition to one or more LEPs. In addition, laser thermal transfer will be used as an example of a method for forming light emitting and other layers, however, it will be recognized that other transfer, patterning, and printing techniques can be used, such as inkjet printing, screen printing, thermal head printing, and photolithographic patterning.

Any non-polymeric, organic material can be used as long as the material can be solution coated to form an amorphous matrix and will resist substantial crystallization during the expected lifetime of the device under the expected operating and storage conditions. Examples of suitable materials are described in J. V. Grazulevicius, P. Strohriegl, "Charge-Transporting Polymers and Molecular Glasses", *Handbook of Advanced Electronic and Photonic Materials and Devices*, H. S. Nalwa (ed.), 10, 233–274 (2001); Shirota, *J. Mater. Chem.*, 10, 1, (2000); Kreger et al., *Synthetic Metals*, 119, 163 (2001); PCT Patent Applications Publication Nos. WO 99/21935 and WO 00/03565; and Robinson et al., *Adv. Mat.*, 2000, 12(22), 1701, all of which are incorporated herein by reference. Preferably, this non-polymeric, organic material does not have a substantial propensity to form or does not form a stable, crystalline phase under the expected operating and storage conditions. In addition, preferably, the non-polymeric, organic material and light emitting material are compatible or soluble in a common solvent or solvents and do not substantially phase separate during solution coating and, more preferably, do not phase separate upon removal of the solvent(s).

In general, when the amorphous matrix is formed, the threshold for reducing cohesion in an amorphous matrix/LEP blend is the point at which the LEP becomes the discontinuous phase (if there are two observable phases) or the point in which the LEP chains are dissolved by the amorphous matrix (if there is a single phase). Generally, the total amount of light emitting polymer or other light emitting molecule is no more than 50 wt. % of the solids of a coating composition and can be 40 wt. %, 25 wt. %, or less of the solids. Typically, the ratio, by weight, of the non-polymeric, organic material to light emitting material (e.g., light emitting polymer or polymers) is at least 1:1 and typically is in the range of 1:1 to 100:1. Generally ratios of at least 1:1, and typically at least 2:1 or 3:1 or more, are suitable for thermal transfer applications.

In some embodiments, the non-polymeric, organic material is also a hole or electron transport material. In some of these embodiments, a hole or electron transport layer is formed using the non-polymeric, organic material and coated with or coated onto a light emitting layer containing the same non-polymeric, organic material as an amorphous matrix for the light emitting material.

In some embodiments, a gradient of light emitting material can be formed by depositing several layers with different concentrations of light emitting material to achieve a desired profile. The thermal transfer methods described below can be useful in creating such structures by sequentially transferring each of the layers. In addition, layers can be formed using different light emitting materials to achieve different colors or to produce, for example, stacked red, green, and blue pixels with intervening electrodes between each pixel.

If the non-polymeric, organic material is not a hole or electron transport material, it can be desirable to include a hole or electron transport material as part of the coating composition. Other materials that can be included in the coating composition include, for example, small molecule dopants (e.g. triplet emitters); other non-polymeric, organic materials; coating aids, surfactants; particulate material to, for example, reduce cohesion; dispersants; stabilizers; and photosensitizers.

In some embodiments, the non-polymeric, organic material used to form the amorphous matrix is also a light emitting molecule. In these embodiments, it is preferred that the materials and operating conditions be selected to favor emission by the light emitting polymer instead of the non-polymeric, organic material which forms the amorphous matrix. For example, the non-polymeric, organic material may be capable of emitting light in the blue region of the spectrum. In this instance, a light emitting polymer could be selected which emits in the red or green regions of the spectrum. Selection can be based on, for example, the mechanism(s) of molecular energy transfer and the bandgap of the materials.

Examples of suitable non-polymeric, organic materials that can form an amorphous matrix when solution coated include molecules having a tetrahedral core with pendant electrically active groups. Examples of such molecules include tetraphenyl methanes 1, tetraphenyl silanes 2, and tetraphenyl adamantanes 3, as well as tetraphenyl germanes, tetraphenyl plumbanes, and tetraphenyl stannanes (i.e., replace Si in 2 with Ge, Pb, or Sn, respectively):

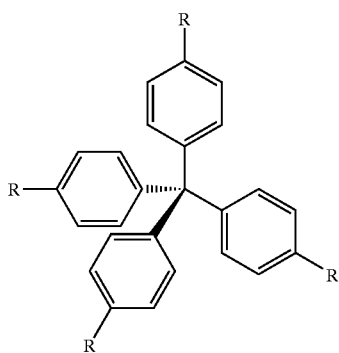

1

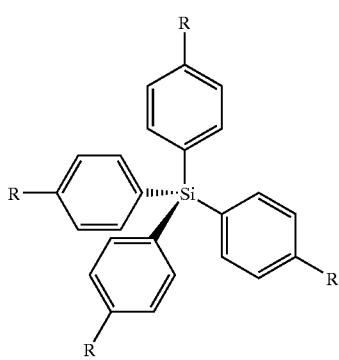

2

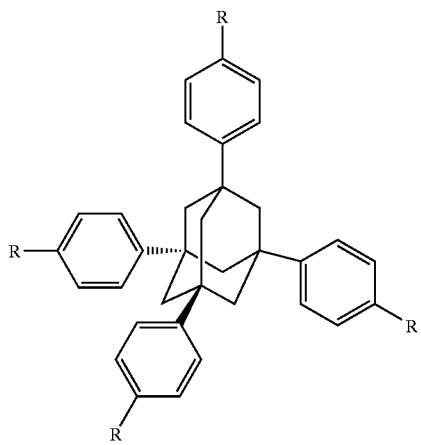

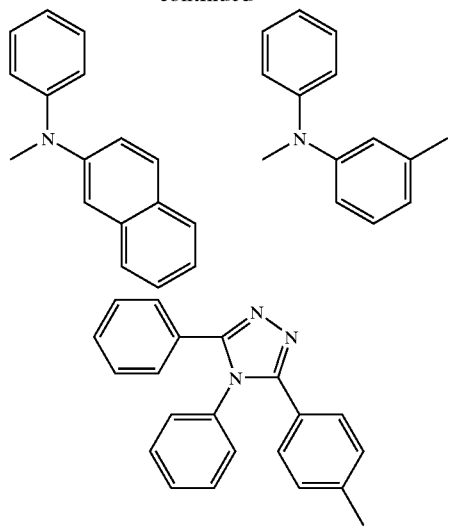

Each R is independently a substituent containing one or more conjugated functional groups (for example, aryl, arylene, heteroaryl, heteroarylene, alkenyl, or alkenylene) that stabilize holes (e.g. as cation radicals), electrons (e.g. as anion radicals), or act as a chromophore. Each R substituent can be the same as or different from the other R substituents. When all the R substituents are the same, the molecule typically has some symmetry. When at least one of the R substituents is different, the molecule has asymmetry which may further facilitate the formation and retention of an amorphous matrix. In some instances, R includes an aromatic ring that is fused to the phenyl group to which R is attached to form, for example, a substituted or unsubstituted naphthyl or other fused ring structure. Examples and further descriptions of such materials can be found in, for example, PCT Patent Application Publication No. WO 00/03565 and Robinson et al., *Adv. Mat.*, 2000, 12(22), 1701, both of which are incorporated herein by reference.

In some embodiments, the substituents R include one or more conjugated structures having, for example, one or more alkenyl, alkenylene, aryl, arylene (e.g., phenylene, naphthylene, or anthrylene), heteroaryl, or heteroarylene functional groups. The substituents can have extended π-conjugated systems which can include heteroatoms such as nitrogen and oxygen. The conjugated systems can include electron rich moieties (e.g. a triarylamine) to stabilize cation radicals (e.g. holes), electron poor moieties to stabilize anion radicals (e.g. electrons), or a HOMO-LUMO (Highest Occupied Molecular Orbital-Lowest Unoccupied Molecular Orbital) gap in the ultraviolet to visible range to act as a chromophore. Examples of suitable R groups include, but are not limited to, the following:

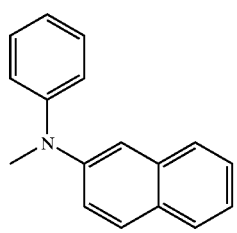

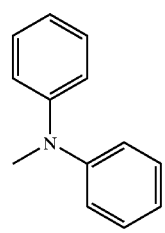

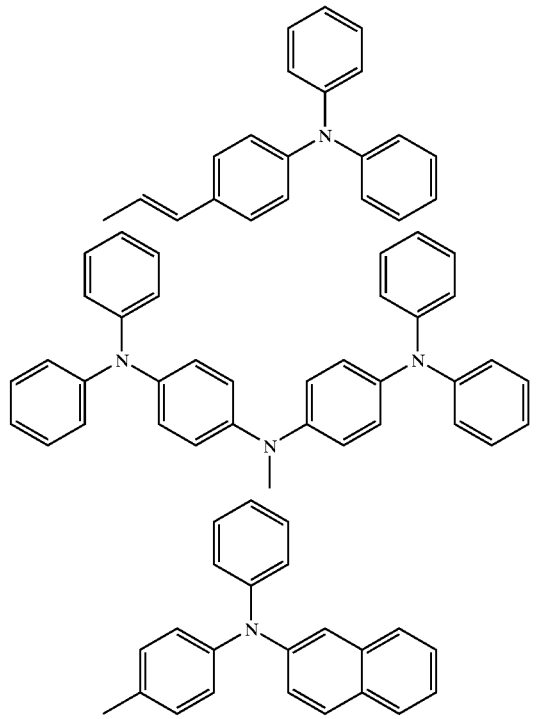

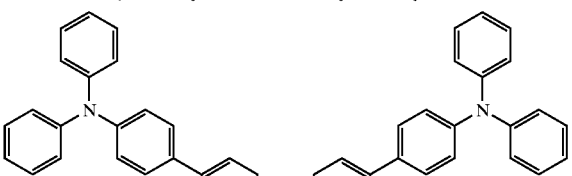

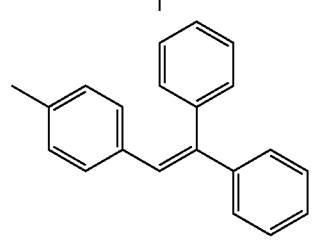

-continued
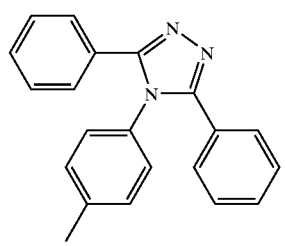
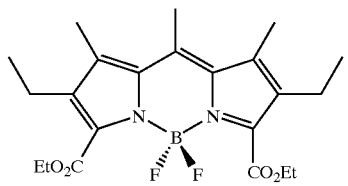
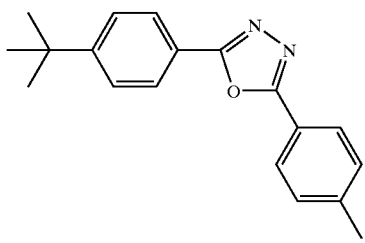
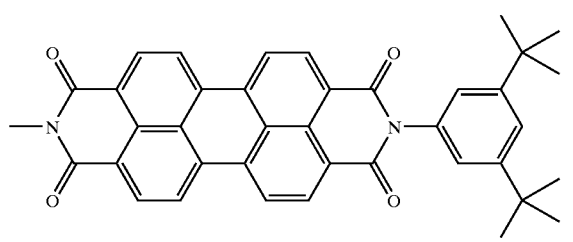
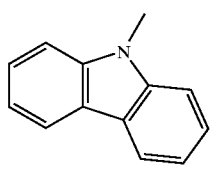
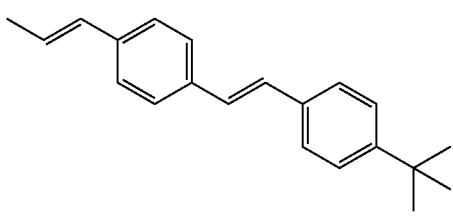
Specific examples of suitable tetrahedral core materials include compounds 4–6:
4
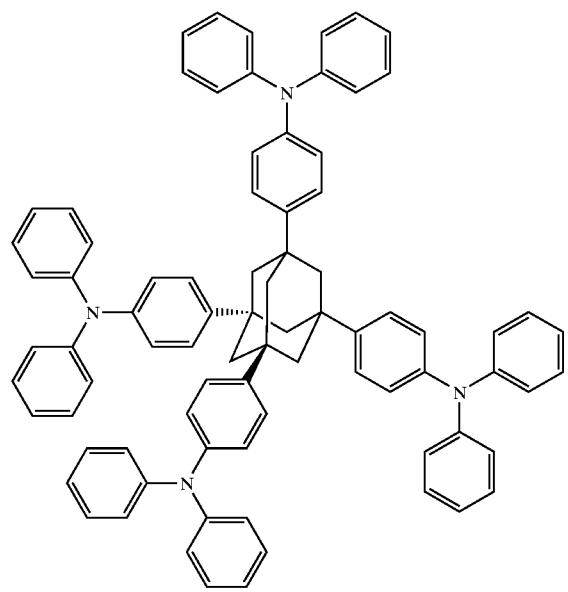
5
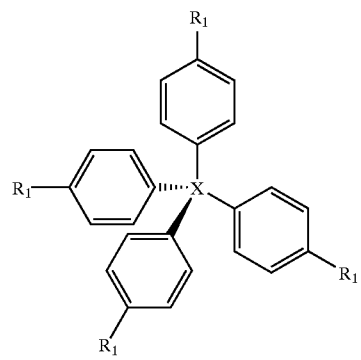
6
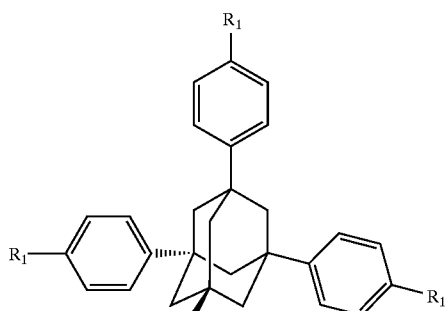
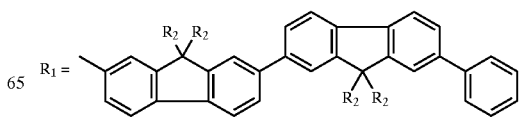

X is C, Si, Ge, Pb, or Sn and $R_2$ is H or alkyl. Compounds 5 and 6 include fluorene moieties that can be chromophoric. These particular fluorenes typically have band gaps in the blue to ultraviolet range. Such materials can be useful with LEPs that emit in the red or green regions so that emission is primarily or exclusively from the LEP.

Also among this type of compounds are spiro compounds such as compounds 7–9:

7

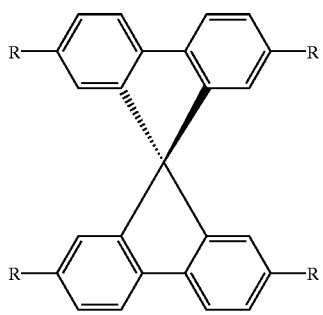

8

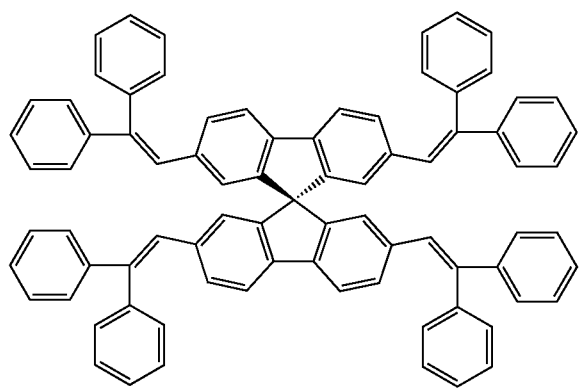

9

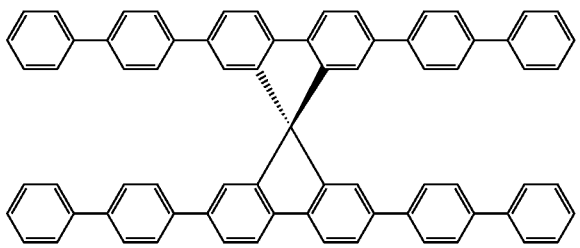

where each R is independently a conjugated structure having one or more alkenyl, alkenylene, aryl, arylene (e.g., phenylene, naphthylene, or anthrylene), heteroaryl, or heteroarylene functional groups. The substituents can have extended π-conjugated systems which can include heteroatoms such as nitrogen and oxygen. The conjugated systems can include electron rich moieties (e.g. a triarylamine) to stabilize cation radicals (e.g. holes), electron poor moieties to stabilize anion radicals (e.g. electrons), or a HOMO-LUMO (Highest Occupied Molecular Orbital-Lowest Unoccupied Molecular Orbital) gap in the ultraviolet to visible range to act as a chromophore.

Other materials that can be used to form amorphous, non-polymeric, organic matrices include dendrimers. Dendrimeric compounds have a core moiety with three or more dendritic substituents extending from the core moiety. Examples of suitable core moieties include triphenylamine, benzene, pyridine, pyrimidine, and others described in PCT Patent Application Serial No. WO 99/21935, incorporated herein by reference. The dendritic substituents typically contain two or more aryl, arylene (e.g., phenylene), heteroaryl, heteroarylene, alkenyl, or alkenylene substituents. In some embodiments, the substituents can be conjugated structures having one or more alkenyl, alkenylene, aryl, arylene (e.g., phenylene, naphthylene, or anthrylene), heteroaryl, or heteroarylene moieties. The dendritic substituents can be the same or different. Examples of dendrimeric compounds include starburst compounds based on, for example, triphenylamines, such as compounds 10–16:

10

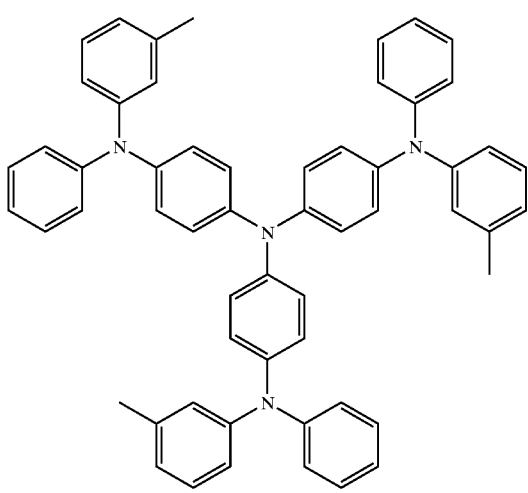

11

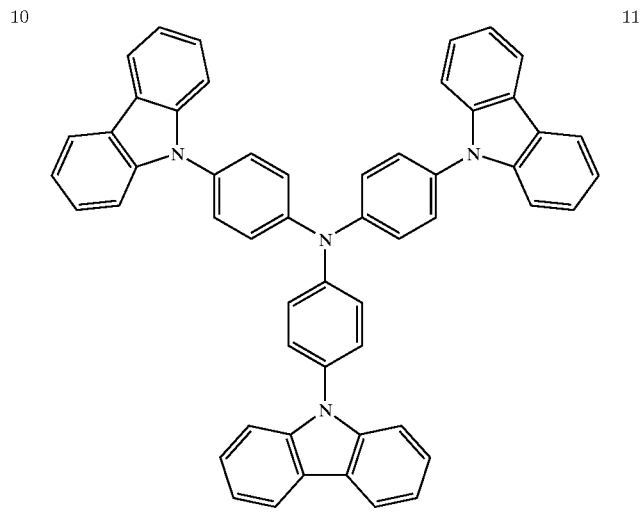

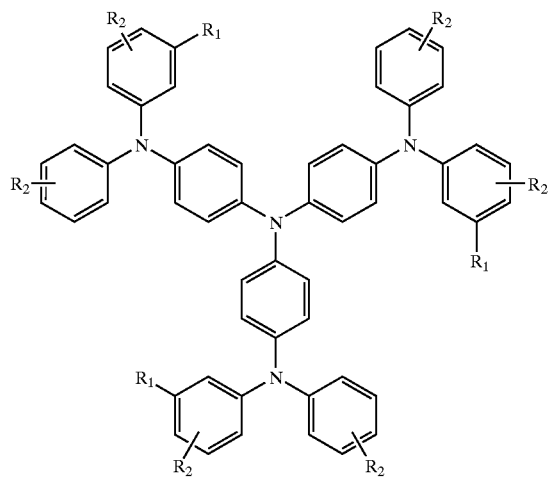
12
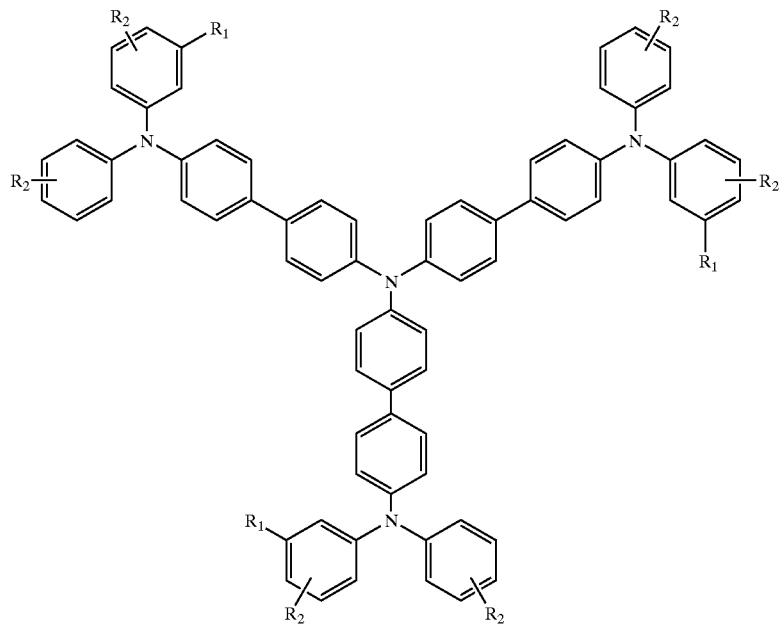
13
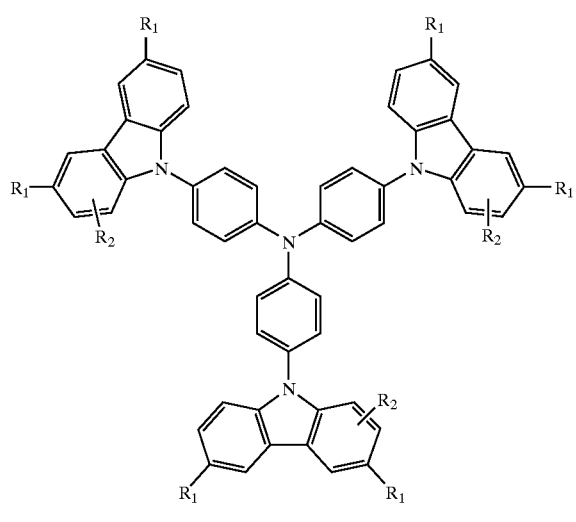
14
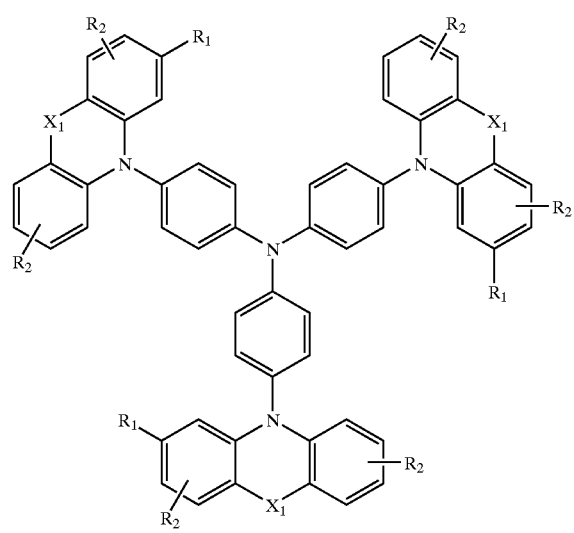
15

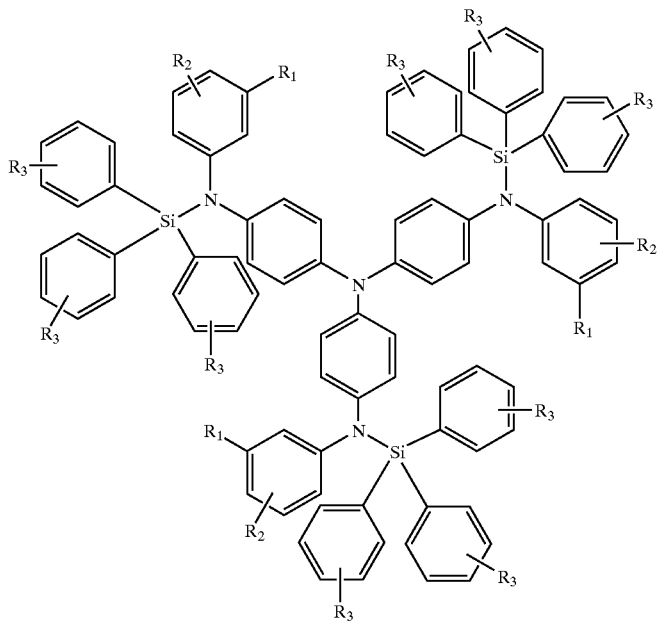

16

Each $R_1$ and $R_2$ is independently H, F, Cl, Br, I, —SH, —OH, alkyl, aryl, heteroaryl, fluoroalkyl, fluoroalkylalkoxy, alkenyl, alkoxy, amino, or alkyl-COOH. Each $R_3$ is independently H, F, Cl, Br, I, alkyl, fluoroalkyl, alkoxy, aryl, amino, cyano, or nitro. Each $X_1$ is independently O, S, Se, $NR_3$, $BR_3$, or $PR_3$. The alkyl, aryl, and heteroaryl portions of any of these substituents can be substituted or unsubstituted. Each $R_1$, $R_2$, $R_3$, and $X_1$ can be the same as or different from similarly labeled substituents (i.e., all $R_1$ substituents can be the same as or one or more of the $R_1$ substituents can be different from each other).

Other dendrimer compounds can have an aryl or heteroaryl moiety as a core, such as compounds 17–26:

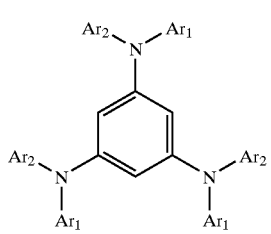

17

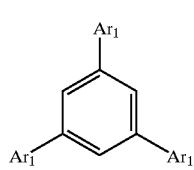

18

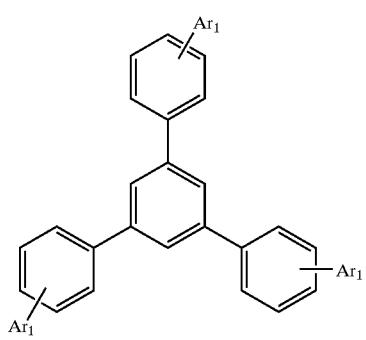

19

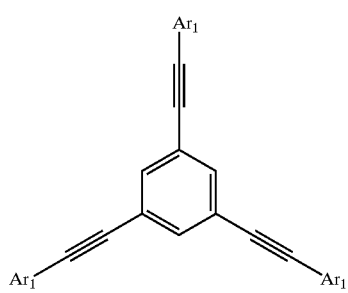

20

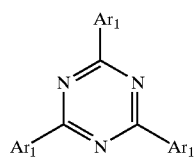
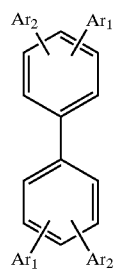
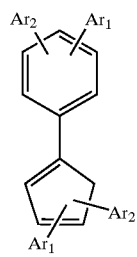
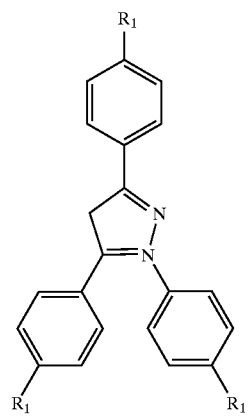
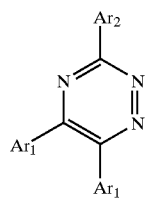
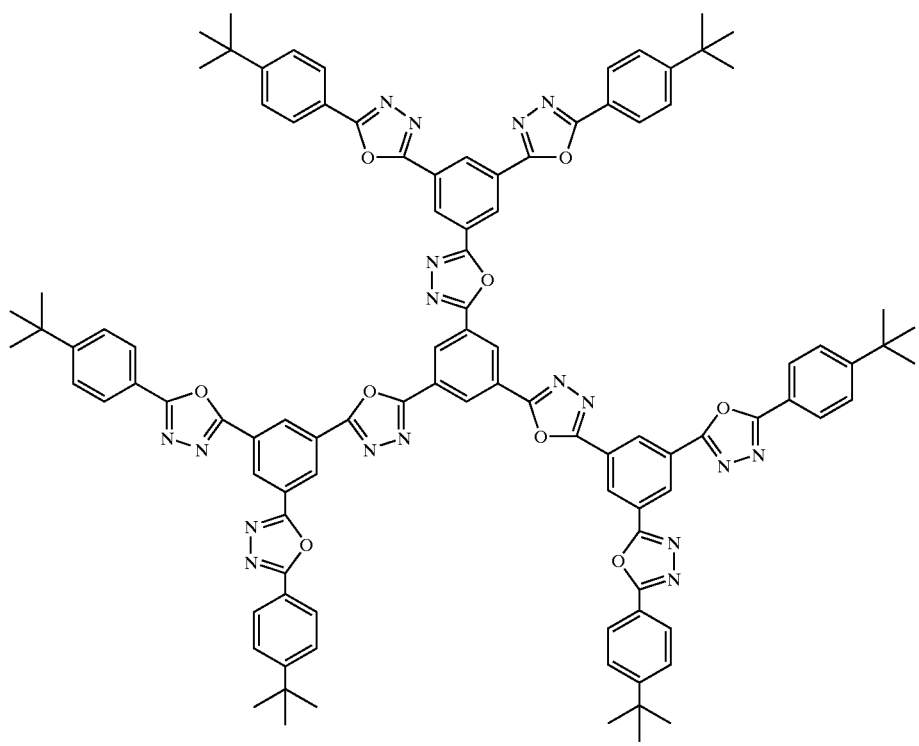

Each $Ar_1$ and $Ar_2$ is independently a substituted or unsubstituted aryl or heteroaryl, including, for example, substituted or unsubstituted phenyl, pyridine, pyrole, furan, thiophene, or one of the following structures:

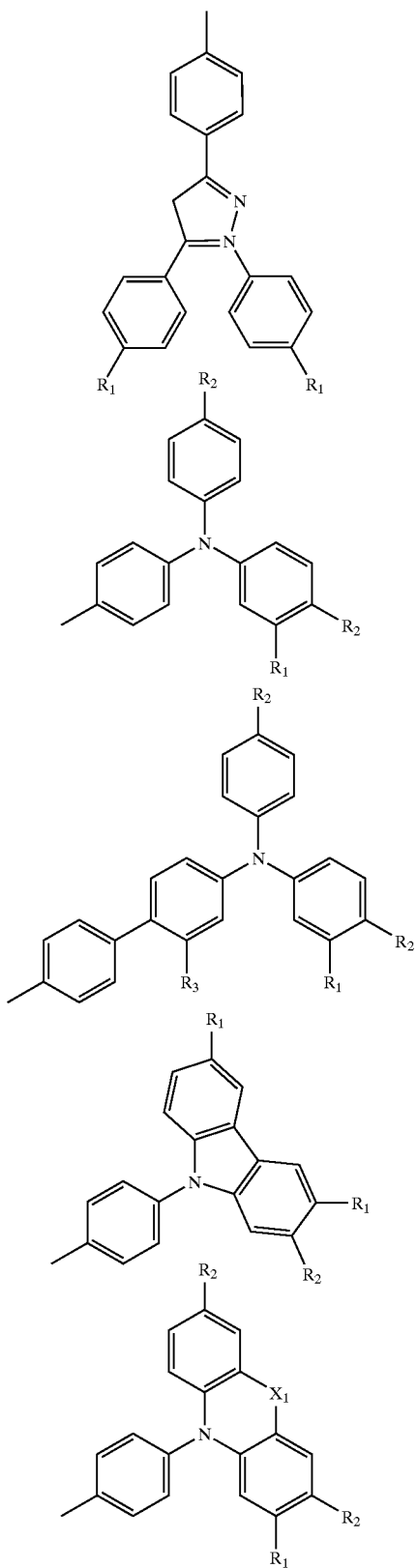

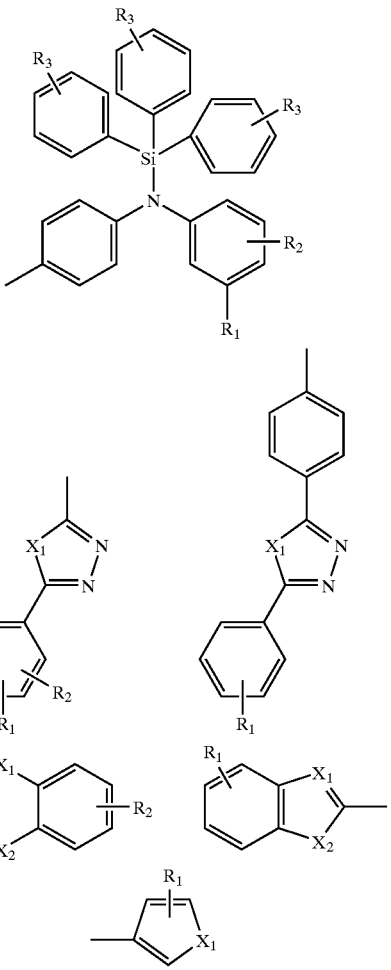

Each $R_1$ and $R_2$ is independently H, F, Cl, Br, I, —SH, —OH, alkyl, aryl, heteroaryl, fluoroalkyl, fluoroalkylalkoxy, alkenyl, alkoxy, amino, or alkyl-COOH. Each $R_3$ is independently H, F, Cl, Br, I, alkyl, fluoroalkyl, alkoxy, aryl, amino, cyano, or nitro. Each $X_1$ and $X_2$ is independently O, S, Se, $NR_3$, $BR_3$, or $PR_3$. The alkyl, aryl, and heteroaryl portions of any of these substituents can be substituted or unsubstituted. Each $R_1$, $R_2$, $R_3$, $X_1$, and $X_2$ can be the same as or different from similarly labeled substituents (i.e., all $R_1$ substituents can be the same as or one or more of the $R_1$ substituents can be different from each other).

Other amorphous materials include, for example, compounds 27–32:

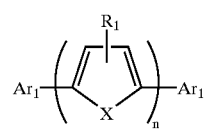

27

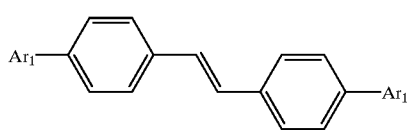

28

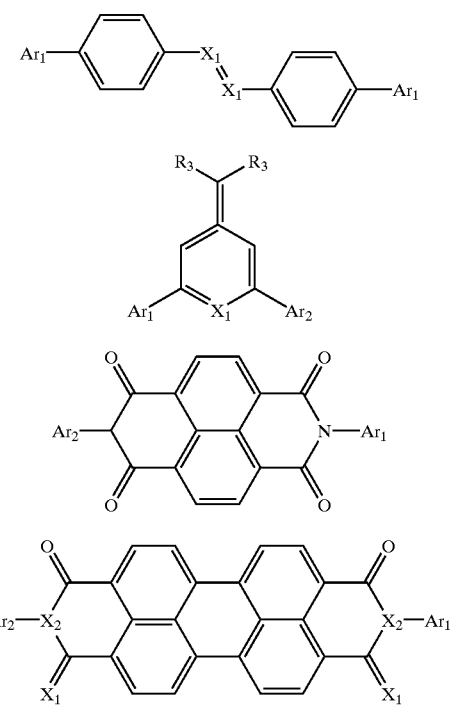

Each $Ar_1$ and $Ar_2$ is independently a substituted or unsubstituted aryl or heteroaryl, n is an integer in the range of 1 to 6, and each $R_1$ is independently H, F, Cl, Br, I, —SH, —OH, alkyl, aryl, heteroaryl, fluoroalkyl, fluoroalkylalkoxy, alkenyl, alkoxy, amino, or alkyl-COOH. Each $R_3$ is independently H, F, Cl, Br, I, alkyl, fluoroalkyl, alkoxy, aryl, amino, cyano, or nitro. Each X, $X_1$, and $X_2$ are independently O, S, Se, $NR_3$, $BR_3$, or $PR_3$. The alkyl, aryl, and heteroaryl portions of any of these substituents can be substituted or unsubstituted. Each $R_1$, $R_2$, $R_3$, X, $X_1$, and $X_2$ can be the same as or different from similarly labeled substituents (i.e., all $R_1$ substituents can be the same as or one or more of the $R_1$ substituents can be different from each other).

Unless otherwise indicated, the term "alkyl" includes both straight-chained, branched, and cyclic alkyl groups and includes both unsubstituted and substituted alkyl groups. Unless otherwise indicated, the alkyl groups are typically C1–C20. Examples of "alkyl" as used herein include, but are not limited to, methyl, ethyl, n-propyl, n-butyl, n-pentyl, isobutyl, and isopropyl, and the like.

Unless otherwise indicated, the term "alkylene" includes both straight-chained, branched, and cyclic divalent hydrocarbon radicals and includes both unsubstituted and substituted alkenylene groups. Unless otherwise indicated, the alkylene groups are typically C1–C20. Examples of "alkylene" as used herein include, but are not limited to, methylene, ethylene, propylene, butylene, and isopropylene, and the like.

Unless otherwise indicated, the term "alkenyl" includes both straight-chained, branched, and cyclic monovalent hydrocarbon radicals have one or more double bonds and includes both unsubstituted and substituted alkenyl groups. Unless otherwise indicated, the alkenyl groups are typically C2–C20. Examples of "alkenylene" as used herein include, but are not limited to, ethenyl, propenyl, and the like.

Unless otherwise indicated, the term "alkenylene" includes both straight-chained, branched, and cyclic divalent hydrocarbon radicals have one or more double bonds and includes both unsubstituted and substituted alkenylene groups. Unless otherwise indicated, the alkylene groups are typically C2–C20. Examples of "alkenylene" as used herein include, but are not limited to, ethene-1,2-diyl, propene-1,3-diyl, and the like.

Unless otherwise indicated, the term "aryl" refers to monovalent unsaturated aromatic carbocyclic radicals having one to fifteen rings, such as phenyl or bipheynyl, or multiple fused rings, such as naphthyl or anthryl, or combinations thereof. Examples of aryl as used herein include, but are not limited to, phenyl, 2-naphthyl, 1-naphthyl, biphenyl, 2-hydroxyphenyl, 2-aminophenyl, 2-methoxyphenyl and the like.

Unless otherwise indicated, the term "arylene" refers to divalent unsaturated aromatic carbocyclic radicals having one to fifteen rings, such as phenylene, or multiple fused rings, such as naphthylene or anthrylene, or combinations thereof. Examples of "arylene" as used herein include, but are not limited to, benzene-1,2-diyl, benzene-1,3-diyl, benzene-1,4-diyl, naphthalene-1,8-diyl, anthracene-1,4-diyl, and the like.

Unless otherwise indicated, the term "heteroaryl" refers to functional groups containing a monovalent five-to seven-membered aromatic ring radical with one or more heteroatoms independently selected from S, O, or N. Such a heteroaryl ring may be optionally fused to one or more of another heterocyclic ring(s), heteroaryl ring(s), aryl ring(s), cycloalkenyl ring(s), or cycloalkyl rings. Examples of "heteroaryl" used herein include, but are not limited to, furyl, thiophenyl, pyrrolyl, imidazolyl, pyrazolyl, triazolyl, tetrazolyl, thiazolyl, oxazolyl, isoxazolyl, oxadiazolyl, thiadiazolyl, isothiazolyl, pyridinyl, pyridazinyl, pyrazinyl, pyrimidinyl, quinolinyl, isoquinolinyl, benzofuryl, benzothiophenyl, indolyl, and indazolyl, and the like.

Unless otherwise indicated, the term "heteroarylene" refers to functional groups containing a divalent five-to seven-membered aromatic ring radical with one or more heteroatoms independently selected from S, O, or N. Such a heteroarylene ring may be optionally fused to one or more of another heterocyclic ring(s), heteroaryl ring(s), aryl ring(s), cycloalkenyl ring(s), or cycloalkyl rings. Examples of "heteroarylene" used herein include, but are not limited to, furan-2,5-diyl, thiophene-2,4-diyl, 1,3,4-oxadiazole-2,5-diyl, 1,3,4-thiadiazole-2,5-diyl, 1,3-thiazole-2,4-diyl, 1,3-thiazole-2,5-diyl, pyridine-2,4-diyl, pyridine-2,3-diyl, pyridine-2,5-diyl, pyrimidine-2,4-diyl, quinoline-2,3-diyl, and the like.

Suitable substituents for substituted alkyl, alkylene, alkenyl, alkenylene, aryl, arylene, heteroaryl, and heteroarylene groups include, but are not limited to, alkyl, alkylene, alkoxy, aryl, arylene, heteroaryl, heteroarylene, alkenyl, alkenylene, amino, F, Cl, Br, I, —OH, —SH, cyano, nitro, —COOH, and —COO-alkyl.

It will be recognized that electrically active materials other than light emitting materials can be disposed in an amorphous, non-polymeric, organic matrix. For example, a conducting or semiconducting material can be disposed in the amorphous, non-polymeric, organic matrix. Application examples include the formation of a hole transport layer or electron transport layer or other charge conducting layer by disposing a hole transport material or electron transport material in an amorphous, non-polymeric, organic matrix. The matrix can be formed using, for example, any of the materials described above. This structure can be particularly useful for conducting or semiconducting polymeric materials to produce a layer with lower cohesive strength than the polymer itself.

A variety of light emitting materials including LEP and SM light emitters can be used. Examples of classes of suitable LEP materials include poly(phenylenevinylene)s (PPVs), poly-para-phenylenes (PPPs), polyfluorenes (PFs), other LEP materials now known or later developed, and co-polymers or blends thereof. Suitable LEPs can also be molecularly doped, dispersed with fluorescent dyes or other PL materials, blended with active or non-active materials, dispersed with active or non-active materials, and the like. Examples of suitable LEP materials are described in Kraft, et al., *Angew. Chem. Int. Ed.*, 37, 402–428 (1998); U.S. Pat. Nos. 5,621,131; 5,708,130; 5,728,801; 5,840,217; 5,869,350; 5,900,327; 5,929,194; 6,132,641; and 6,169,163; and PCT Patent Application Publication No. 99/40655, all of which are incorporated herein by reference.

SM materials are generally non-polymer organic or organometallic molecular materials that can be used in OEL displays and devices as emitter materials, charge transport materials, as dopants in emitter layers (e.g., to control the emitted color) or charge transport layers, and the like. Commonly used SM materials include metal chelate compounds, such as tris(8-hydroxyquinoline)aluminum (Alq3), and N,N'-bis(3-methylphenyl)-N,N'-diphenylbenzidine (TPD). Other SM materials are disclosed in, for example, C. H. Chen, et al., *Macromol. Symp.* 125, 1 (1997), Japanese Laid Open Patent Application 2000–195673, U.S. Pat. Nos. 6,030,715, 6,150,043, and 6,242,115 and, PCT Patent Applications Publication Nos. WO 00/18851 (divalent lanthanide metal complexes), WO 00/70655 (cyclometallated iridium compounds and others), and WO 98/55561, all of which are incorporated herein by reference.

Referring back to FIG. 1, device layer 110 is disposed on substrate 120. Substrate 120 can be any substrate suitable for OEL device and display applications. For example, substrate 120 can comprise glass, clear plastic, or other suitable material(s) that are substantially transparent to visible light. Substrate 120 can also be opaque to visible light, for example stainless steel, crystalline silicon, poly-silicon, or the like. Because some materials in OEL devices can be particularly susceptible to damage due to exposure to oxygen or water, substrate 120 preferably provides an adequate environmental barrier, or is supplied with one or more layers, coatings, or laminates that provide an adequate environmental barrier.

Substrate 120 can also include any number of devices or components suitable in OEL devices and displays such as transistor arrays and other electronic devices; color filters, polarizers, wave plates, diffusers, and other optical devices; insulators, barrier ribs, black matrix, mask work and other such components; and the like. Generally, one or more electrodes will be coated, deposited, patterned, or otherwise disposed on substrate 120 before forming the remaining layer or layers of the OEL device or devices of the device layer 110. When a light transmissive substrate 120 is used and the OEL device or devices are bottom emitting, the electrode or electrodes that are disposed between the substrate 120 and the emissive material(s) are preferably substantially transparent to light, for example transparent conductive electrodes such as indium tin oxide (ITO) or any of a number of other transparent conductive oxides.

Element 130 can be any element or combination of elements suitable for use with OEL display or device 100. For example, element 130 can be an LCD module when device 100 is a backlight. One or more polarizers or other elements can be provided between the LCD module and the backlight device 100, for instance an absorbing or reflective clean-up polarizer. Alternatively, when device 100 is itself an information display, element 130 can include one or more of polarizers, wave plates, touch panels, antireflective coatings, anti-smudge coatings, projection screens, brightness enhancement films, or other optical components, coatings, user interface devices, or the like.

Organic electronic devices containing materials for light emission can be made at least in part by selective thermal transfer of light emitting material from a thermal transfer donor sheet to a desired receptor substrate. For example, light emitting polymer displays and lamps can be made coating an LEP and a non-polymeric, organic material capable of forming an amorphous matrix on a donor sheet and then selectively transferring the LEP layer alone or along with other device layers or materials to the display substrate.

Figure 2:
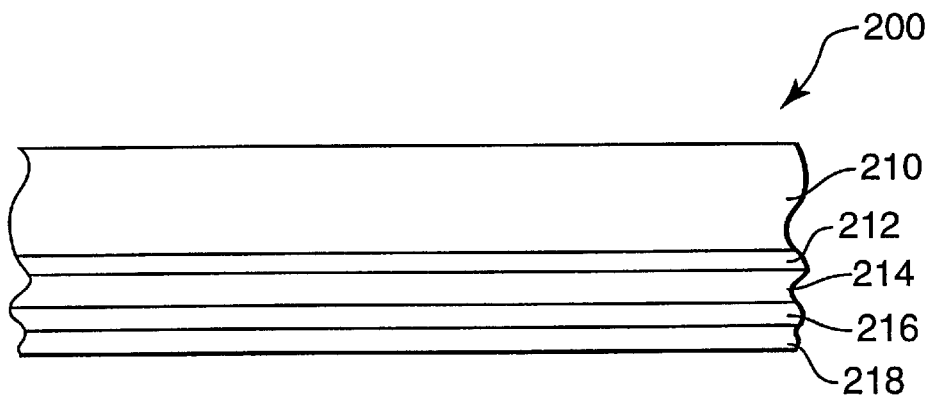
FIG. 2 is a schematic side view of a donor sheet for transferring materials according to the present invention.

Selective thermal transfer of layers containing light emitting materials for organic electronic devices can be performed using a thermal transfer donor. FIG. 2 shows an example of a thermal transfer donor 200 suitable for use in the present invention. Donor element 200 includes a base substrate 210, an optional underlayer 212, an optional light-to-heat conversion layer (LTHC layer) 214, an optional interlayer 216, and a transfer layer 218 that comprises an oriented or orientable emissive material or functional alignment layer. Each of these elements are described in more detail in the discussion that follows. Other layers can also be present. Examples of suitable donors or layers of donors are disclosed in U.S. Pat. Nos. 6,242,152; 6,228,555; 6,228,543; 6,221,553; 6,221,543; 6,214,520; 6,194,119; 6,114,088; 5,998,085; 5,725,989; 5,710,097; 5,695,907; and 5,693,446, and in co-assigned U.S. patent application Ser. Nos. 09/853,062; 09/844,695; 09/844,100; 09/662,980; 09/662,845; 09/473,114; and 09/451,984, all of which are incorporated herein by reference.

In processes of the present invention, emissive organic materials, including LEPs or other materials, can be selectively transferred from the transfer layer of a donor sheet to a receptor substrate by placing the transfer layer of the donor element adjacent to the receptor and selectively heating the donor element. Illustratively, the donor element can be selectively heated by irradiating the donor element with imaging radiation that can be absorbed by light-to-heat converter material disposed in the donor, often in a separate LTHC layer, and converted into heat. In these cases, the donor can be exposed to imaging radiation through the donor substrate, through the receptor, or both. The radiation can include one or more wavelengths, including visible light, infrared radiation, or ultraviolet radiation, for example from a laser, lamp, or other such radiation source. Other selective heating methods can also be used, such as using a thermal print head or using a thermal hot stamp (e.g., a patterned thermal hot stamp such as a heated silicone stamp that has a relief pattern that can be used to selectively heat a donor). Material from the thermal transfer layer can be selectively transferred to a receptor in this manner to imagewise form patterns of the transferred material on the receptor. In many instances, thermal transfer using light from, for example, a lamp or laser, to patternwise expose the donor can be advantageous because of the accuracy and precision that can often be achieved. The size and shape of the transferred pattern (e.g., a line, circle, square, or other shape) can be controlled by, for example, selecting the size of the light beam, the exposure pattern of the light beam, the duration of directed beam contact with the donor sheet, or the materials of the donor sheet. The transferred pattern can also be controlled by irradiating the donor element through a mask.

As mentioned, a thermal print head or other heating element (patterned or otherwise) can also be used to selectively heat the donor element directly, thereby pattern-wise transferring portions of the transfer layer. In such cases, the light-to-heat converter material in the donor sheet is optional. Thermal print heads or other heating elements may be particularly suited for making lower resolution patterns of material or for patterning elements whose placement need not be precisely controlled.

Transfer layers can also be transferred from donor sheets without selectively transferring the transfer layer. For example, a transfer layer can be formed on a donor substrate that, in essence, acts as a temporary liner that can be released after the transfer layer is contacted to a receptor substrate, typically with the application of heat or pressure. Such a method, referred to as lamination transfer, can be used to transfer the entire transfer layer, or a large portion thereof, to the receptor.

The mode of thermal mass transfer can vary depending on the type of selective heating employed, the type of irradiation if used to expose the donor, the type of materials and properties of the optional LTHC layer, the type of materials in the transfer layer, the overall construction of the donor, the type of receptor substrate, and the like. Without wishing to be bound by any theory, transfer generally occurs via one or more mechanisms, one or more of which may be emphasized or de-emphasized during selective transfer depending on imaging conditions, donor constructions, and so forth. One mechanism of thermal transfer includes thermal melt-stick transfer whereby localized heating at the interface between the thermal transfer layer and the rest of the donor element can lower the adhesion of the thermal transfer layer to the donor in selected locations. Selected portions of the thermal transfer layer can adhere to the receptor more strongly than to the donor so that when the donor element is removed, the selected portions of the transfer layer remain on the receptor. Another mechanism of thermal transfer includes ablative transfer whereby localized heating can be used to ablate portions of the transfer layer off of the donor element, thereby directing ablated material toward the receptor. Yet another mechanism of thermal transfer includes sublimation whereby material dispersed in the transfer layer can be sublimated by heat generated in the donor element. A portion of the sublimated material can condense on the receptor. The present invention contemplates transfer modes that include one or more of these and other mechanisms whereby selective heating of a donor sheet can be used to cause the transfer of materials from a transfer layer to receptor surface.

A variety of radiation-emitting sources can be used to heat donor sheets. For analog techniques (e.g., exposure through a mask), high-powered light sources (e.g., xenon flash lamps and lasers) are useful. For digital imaging techniques, infrared, visible, and ultraviolet lasers are particularly useful. Suitable lasers include, for example, high power ($\geqq 100$ mW) single mode laser diodes, fiber-coupled laser diodes, and diode-pumped solid state lasers (e.g., Nd:YAG and Nd:YLF). Laser exposure dwell times can vary widely from, for example, a few hundredths of microseconds to tens of microseconds or more, and laser fluences can be in the range from, for example, about 0.01 to about 5 J/cm$^2$ or more. Other radiation sources and irradiation conditions can be suitable based on, among other things, the donor element construction, the transfer layer material, the mode of thermal mass transfer, and other such factors.

When high spot placement accuracy is desired (e.g., when patterning elements for high information content displays and other such applications) over large substrate areas, a laser can be particularly useful as the radiation source. Laser sources are also compatible with both large rigid substrates (e.g., 1 m×1 m×1.1 mm glass) and continuous or sheeted film substrates (e.g., 100 µm thick polyimide sheets).

During imaging, the donor sheet can be brought into intimate contact with a receptor (as might typically be the case for thermal melt-stick transfer mechanisms) or the donor sheet can be spaced some distance from the receptor (as can be the case for ablative transfer mechanisms or material sublimation transfer mechanisms). In at least some instances, pressure or vacuum can be used to hold the donor sheet in intimate contact with the receptor. In some instances, a mask can be placed between the donor sheet and the receptor. Such a mask can be removable or can remain on the receptor after transfer. If a light-to-heat converter material is present in the donor, radiation source can then be used to heat the LTHC layer (or other layer(s) containing radiation absorber) in an imagewise fashion (e.g., digitally or by analog exposure through a mask) to perform imagewise transfer or patterning of the transfer layer from the donor sheet to the receptor.

Typically, selected portions of the transfer layer are transferred to the receptor without transferring significant portions of the other layers of the donor sheet, such as the optional interlayer or LTHC layer. The presence of the optional interlayer may eliminate or reduce the transfer of material from an LTHC layer to the receptor or reduce distortion in the transferred portion of the transfer layer. Preferably, under imaging conditions, the adhesion of the optional interlayer to the LTHC layer is greater than the adhesion of the interlayer to the transfer layer. The interlayer can be transmissive, reflective, or absorptive to imaging radiation, and can be used to attenuate or otherwise control the level of imaging radiation transmitted through the donor or to manage temperatures in the donor, for example to reduce thermal or radiation-based damage to the transfer layer during imaging. Multiple interlayers can be present.

Large donor sheets can be used, including donor sheets that have length and width dimensions of a meter or more. In operation, a laser can be rastered or otherwise moved across the large donor sheet, the laser being selectively operated to illuminate portions of the donor sheet according to a desired pattern. Alternatively, the laser may be stationary and the donor sheet or receptor substrate moved beneath the laser.

In some instances, it may be necessary, desirable, or convenient to sequentially use two or more different donor sheets to form electronic devices on a receptor. For example, multiple layer devices can be formed by transferring separate layers or separate stacks of layers from different donor sheets. Multilayer stacks can also be transferred as a single transfer unit from a single donor element. For example, a hole transport layer and a LEP layer can be co-transferred from a single donor. As another example, a semiconductive polymer and an emissive layer can be co-transferred from a single donor. Multiple donor sheets can also be used to form separate components in the same layer on the receptor. For example, three different donors that each have a transfer layer comprising a LEP capable of emitting a different color (for example, red, green, and blue) can be used to form RGB sub-pixel OEL devices for a full color polarized light emitting electronic display. As another example, a conductive or semiconductive polymer can be patterned via thermal transfer from one donor, followed by selective thermal transfer of emissive layers from one or more other donors to form a plurality of OEL devices in a display. As still another example, layers for organic transistors can be patterned by selective thermal transfer of electrically active organic materials (oriented or not), followed by selective thermal transfer patterning of one or more pixel or sub-pixel elements such as color filters, emissive layers, charge transport layers, electrode layers, and the like.

Materials from separate donor sheets can be transferred adjacent to other materials on a receptor to form adjacent devices, portions of adjacent devices, or different portions of the same device. Alternatively, materials from separate donor sheets can be transferred directly on top of, or in partial overlying registration with, other layers or materials previously patterned onto the receptor by thermal transfer or some other method (e.g., photolithography, deposition through a shadow mask, etc.). A variety of other combinations of two or more donor sheets can be used to form a device, each donor sheet forming one or more portions of the device. It will be understood that other portions of these devices, or other devices on the receptor, may be formed in whole or in part by any suitable process including photolithographic processes, ink jet processes, and various other printing or mask-based processes, whether conventionally used or newly developed.

Referring back to FIG. 2, various layers of the donor sheet 200 will now be described.

The donor substrate 210 can be a polymer film. One suitable type of polymer film is a polyester film, for example, polyethylene terephthalate (PET) or polyethylene naphthalate (PEN) films. However, other films with sufficient optical properties, including high transmission of light at a particular wavelength, or sufficient mechanical and thermal stability properties, depending on the particular application, can be used. The donor substrate, in at least some instances, is flat so that uniform coatings can be formed thereon. The donor substrate is also typically selected from materials that remain stable despite heating of one or more layers of the donor. However, as described below, the inclusion of an underlayer between the substrate and an LTHC layer can be used to insulate the substrate from heat generated in the LTHC layer during imaging. The typical thickness of the donor substrate ranges from 0.025 to 0.15 mm, preferably 0.05 to 0.1 mm, although thicker or thinner donor substrates may be used.

The materials used to form the donor substrate and an optional adjacent underlayer can be selected to improve adhesion between the donor substrate and the underlayer, to control heat transport between the substrate and the underlayer, to control imaging radiation transport to the LTHC layer, to reduce imaging defects and the like. An optional priming layer can be used to increase uniformity during the coating of subsequent layers onto the substrate and also increase the bonding strength between the donor substrate and adjacent layers.

An optional underlayer 212 may be coated or otherwise disposed between a donor substrate and the LTHC layer, for example to control heat flow between the substrate and the LTHC layer during imaging or to provide mechanical stability to the donor element for storage, handling, donor processing, or imaging. Examples of suitable underlayers and methods of providing underlayers are disclosed in co-assigned U.S. patent application Ser No. 09/743,114, incorporated herein by reference.

The underlayer can include materials that impart desired mechanical or thermal properties to the donor element. For example, the underlayer can include materials that exhibit a low specific heat×density or low thermal conductivity relative to the donor substrate. Such an underlayer may be used to increase heat flow to the transfer layer, for example to improve the imaging sensitivity of the donor.

The underlayer may also include materials for their mechanical properties or for adhesion between the substrate and the LTHC. Using an underlayer that improves adhesion between the substrate and the LTHC layer may result in less distortion in the transferred image. As an example, in some cases an underlayer can be used that reduces or eliminates delamination or separation of the LTHC layer, for example, that might otherwise occur during imaging of the donor media. This can reduce the amount of physical distortion exhibited by transferred portions of the transfer layer. In other cases, however it may be desirable to employ underlayers that promote at least some degree of separation between or among layers during imaging, for example to produce an air gap between layers during imaging that can provide a thermal insulating function. Separation during imaging may also provide a channel for the release of gases that may be generated by heating of the LTHC layer during imaging. Providing such a channel may lead to fewer imaging defects.

The underlayer may be substantially transparent at the imaging wavelength, or may also be at least partially absorptive or reflective of imaging radiation. Attenuation or reflection of imaging radiation by the underlayer may be used to control heat generation during imaging.

Referring again to FIG. 2, an LTHC layer 214 can be included in donor sheets of the present invention to couple irradiation energy into the donor sheet. The LTHC layer preferably includes a radiation absorber that absorbs incident radiation (e.g., laser light) and converts at least a portion of the incident radiation into heat to enable transfer of the transfer layer from the donor sheet to the receptor.

Generally, the radiation absorber(s) in the LTHC layer absorb light in the infrared, visible, or ultraviolet regions of the electromagnetic spectrum and convert the absorbed radiation into heat. The radiation absorber(s) are typically highly absorptive of the selected imaging radiation, providing an LTHC layer with an optical density at the wavelength of the imaging radiation in the range of about 0.2 to 3 or higher. Optical density of a layer is the absolute value of the logarithm (base 10) of the ratio of the intensity of light transmitted through the layer to the intensity of light incident on the layer.

Radiation absorber material can be uniformly disposed throughout the LTHC layer or can be non-homogeneously distributed. For example, as described in co-assigned U.S. patent application Ser. No. 09/474,002, non-homogeneous LTHC layers can be used to control temperature profiles in donor elements. This can give rise to donor sheets that have improved transfer properties (e.g., better fidelity between the intended transfer patterns and actual transfer patterns).

Suitable radiation absorbing materials can include, for example, dyes (e.g., visible dyes, ultraviolet dyes, infrared dyes, fluorescent dyes, and radiation-polarizing dyes), pigments, metals, metal compounds, metal films, and other suitable absorbing materials. Examples of suitable radiation absorbers includes carbon black, metal oxides, and metal sulfides. One example of a suitable LTHC layer can include a pigment, such as carbon black, and a binder, such as an organic polymer. Another suitable LTHC layer includes metal or metal/metal oxide formed as a thin film, for example, black aluminum (i.e., a partially oxidized aluminum having a black visual appearance). Metallic and metal compound films may be formed by techniques, such as, for example, sputtering and evaporative deposition. Particulate coatings may be formed using a binder and any suitable dry or wet coating techniques. LTHC layers can also be formed by combining two or more LTHC layers containing similar or dissimilar materials. For example, an LTHC layer can be formed by vapor depositing a thin layer of black aluminum over a coating that contains carbon black disposed in a binder.

Dyes suitable for use as radiation absorbers in a LTHC layer may be present in particulate form, dissolved in a binder material, or at least partially dispersed in a binder material. When dispersed particulate radiation absorbers are used, the particle size can be, at least in some instances, about 10 μm or less, and may be about 1 μm or less. Suitable dyes include those dyes that absorb in the IR region of the spectrum. A specific dye may be chosen based on factors such as, solubility in, and compatibility with, a specific binder or coating solvent, as well as the wavelength range of absorption.

Pigmentary materials may also be used in the LTHC layer as radiation absorbers. Examples of suitable pigments include carbon black and graphite, as well as phthalocyanines, nickel dithiolenes, and other pigments described in U.S. Pat. Nos. 5,166,024 and 5,351,617. Additionally, black azo pigments based on copper or chromium complexes of, for example, pyrazolone yellow, dianisidine red, and nickel azo yellow can be useful. Inorganic pigments can also be used, including, for example, oxides and sulfides of metals such as aluminum, bismuth, tin, indium, zinc, titanium, chromium, molybdenum, tungsten, cobalt, iridium, nickel, palladium, platinum, copper, silver, gold, zirconium, iron, lead, and tellurium. Metal borides, carbides, nitrides, carbonitrides, bronze-structured oxides, and oxides structurally related to the bronze family (e.g., $WO_{2.9}$) may also be used.

Metal radiation absorbers may be used, either in the form of particles, as described for instance in U.S. Pat. No. 4,252,671, or as films, as disclosed in U.S. Pat. No. 5,256,506. Suitable metals include, for example, aluminum, bismuth, tin, indium, tellurium and zinc.

Suitable binders for use in the LTHC layer include film-forming polymers, such as, for example, phenolic resins (e.g., novolak and resole resins), polyvinyl butyral resins, polyvinyl acetates, polyvinyl acetals, polyvinylidene chlorides, polyacrylates, cellulosic ethers and esters, nitrocelluloses, and polycarbonates. Suitable binders may include monomers, oligomers, or polymers that have been, or can be, polymerized or crosslinked. Additives such as photoinitiators may also be included to facilitate crosslinking of the LTHC binder. In some embodiments, the binder is primarily formed using a coating of crosslinkable monomers or oligomers with optional polymer.

The inclusion of a thermoplastic resin (e.g., polymer) may improve, in at least some instances, the performance (e.g., transfer properties or coatability) of the LTHC layer. It is thought that a thermoplastic resin may improve the adhesion of the LTHC layer to the donor substrate. In one embodiment, the binder includes 25 to 50 wt. % (excluding the solvent when calculating weight percent) thermoplastic resin, and, preferably, 30 to 45 wt. % thermoplastic resin, although lower amounts of thermoplastic resin may be used (e.g., 1 to 15 wt. %). The thermoplastic resin is typically chosen to be compatible (i.e., form a one-phase combination) with the other materials of the binder. In at least some embodiments, a thermoplastic resin that has a solubility parameter in the range of 9 to 13 $(cal/cm^3)^{1/2}$, preferably, 9.5 to 12 $(cal/cm^3)^{1/2}$, is chosen for the binder. Examples of suitable thermoplastic resins include polyacrylics, styrene-acrylic polymers and resins, and polyvinyl butyral.

Conventional coating aids, such as surfactants and dispersing agents, may be added to facilitate the coating process. The LTHC layer may be coated onto the donor substrate using a variety of coating methods known in the art. A polymeric or organic LTHC layer can be coated, in at least some instances, to a thickness of 0.05 μm to 20 μm, preferably, 0.5 μm to 10 μm, and, more preferably, 1 μm to 7 μm. An inorganic LTHC layer can be coated, in at least some instances, to a thickness in the range of 0.0005 to 10 μm, and preferably, 0.001 to 1 μm.

Referring again to FIG. 2, an optional interlayer 216 may be disposed between the LTHC layer 214 and transfer layer 218. The interlayer can be used, for example, to minimize damage and contamination of the transferred portion of the transfer layer and may also reduce distortion in the transferred portion of the transfer layer. The interlayer may also influence the adhesion of the transfer layer to the rest of the donor sheet. Typically, the interlayer has high thermal resistance. Preferably, the interlayer does not distort or chemically decompose under the imaging conditions, particularly to an extent that renders the transferred image non-functional. The interlayer typically remains in contact with the LTHC layer during the transfer process and is not substantially transferred with the transfer layer.

Suitable interlayers include, for example, polymer films, metal layers (e.g., vapor deposited metal layers), inorganic layers (e.g., sol-gel deposited layers and vapor deposited layers of inorganic oxides (e.g., silica, titania, and other metal oxides)), and organic/inorganic composite layers. Organic materials suitable as interlayer materials include both thermoset and thermoplastic materials. Suitable thermoset materials include resins that may be crosslinked by heat, radiation, or chemical treatment including, but not limited to, crosslinked or crosslinkable polyacrylates, polymethacrylates, polyesters, epoxies, and polyurethanes. The thermoset materials may be coated onto the LTHC layer as, for example, thermoplastic precursors and subsequently crosslinked to form a crosslinked interlayer.

Suitable thermoplastic materials include, for example, polyacrylates, polymethacrylates, polystyrenes, polyurethanes, polysulfones, polyesters, and polyimides. These thermoplastic organic materials may be applied via conventional coating techniques (for example, solvent coating, spray coating, or extrusion coating). Typically, the glass transition temperature ($T_g$) of thermoplastic materials suitable for use in the interlayer is 25° C. or greater, preferably 50° C. or greater. In some embodiments, the interlayer includes a thermoplastic material that has a $T_g$ greater than any temperature attained in the transfer layer during imaging. The interlayer may be either transmissive, absorbing, reflective, or some combination thereof, at the imaging radiation wavelength.

Inorganic materials suitable as interlayer materials include, for example, metals, metal oxides, metal sulfides, and inorganic carbon coatings, including those materials that are highly transmissive or reflective at the imaging light wavelength. These materials may be applied to the light-to-heat-conversion layer via conventional techniques (e.g., vacuum sputtering, vacuum evaporation, or plasma jet deposition).

The interlayer may provide a number of benefits. The interlayer may be a barrier against the transfer of material from the light-to-heat conversion layer. It may also modulate the temperature attained in the transfer layer so that thermally unstable materials can be transferred. For example, the interlayer can act as a thermal diffuser to control the temperature at the interface between the interlayer and the transfer layer relative to the temperature attained in the LTHC layer. This may improve the quality (i.e., surface roughness, edge roughness, etc.) of the transferred layer. The presence of an interlayer may also result in improved plastic memory in the transferred material.

The interlayer may contain additives, including, for example, photoinitiators, surfactants, pigments, plasticizers, and coating aids. The thickness of the interlayer may depend on factors such as, for example, the material of the interlayer, the material and properties of the LTHC layer, the material and properties of the transfer layer, the wavelength of the imaging radiation, and the duration of exposure of the donor sheet to imaging radiation. For polymer interlayers, the thickness of the interlayer typically is in the range of 0.05 $\mu$m to 10 $\mu$m. For inorganic interlayers (e.g., metal or metal compound interlayers), the thickness of the interlayer typically is in the range of 0.005 $\mu$m to 10 $\mu$m.

Referring again to FIG. 2, a thermal transfer layer 218 is included in donor sheet 200. Transfer layer 218 can include any suitable material or materials, disposed in one or more layers, alone or in combination with other materials. Transfer layer 218 is capable of being selectively transferred as a unit or in portions by any suitable transfer mechanism when the donor element is exposed to direct heating or to imaging radiation that can be absorbed by light-to-heat converter material and converted into heat.

The present invention contemplates a transfer layer that includes a light emitting, charge transporting, charge blocking, or semiconducting material disposed in a non-polymeric, organic material that forms an amorphous matrix as part of the transfer layer. The present invention contemplates a transfer layer that includes a LEP or other light emitting molecules as the light emitting material. One way of providing the transfer layer is by solution coating the light emitting material and non-polymeric, organic material onto the donor to form an amorphous matrix containing the light emitting material. In this method, the light emitting material and the non-polymeric, organic material can be solubilized by addition of a suitable compatible solvent, and coated onto the alignment layer by spin-coating, gravure coating, mayer rod coating, knife coating and the like. The solvent chosen preferably does not undesirably interact with (e.g., swell or dissolve) any of the already existing layers in the donor sheet. The coating can then be annealed and the solvent evaporated to leave a transfer layer containing an amorphous matrix.

The transfer layer can then be selectively thermally transferred from the donor element to a proximately located receptor substrate. There can be, if desired, more than one transfer layer so that a multilayer construction is transferred using a single donor sheet. The additional transfer layers can include an amorphous, non-polymeric, organic matrix or some other materials. The receptor substrate may be any item suitable for a particular application including, but not limited to, glass, transparent films, reflective films, metals, semiconductors, and plastics. For example, receptor substrates may be any type of substrate or display element suitable for display applications. Receptor substrates suitable for use in displays such as liquid crystal displays or emissive displays include rigid or flexible substrates that are substantially transmissive to visible light. Examples of suitable rigid receptors include glass and rigid plastic that are coated or patterned with indium tin oxide or are circuitized with low temperature poly-silicon (LTPS) or other transistor structures, including organic transistors.

Suitable flexible substrates include substantially clear and transmissive polymer films, reflective films, transflective films, polarizing films, multilayer optical films, and the like. Flexible substrates can also be coated or patterned with electrode materials or transistors, for example transistor arrays formed directly on the flexible substrate or transferred to the flexible substrate after being formed on a temporary carrier substrate. Suitable polymer substrates include polyester base (e.g., polyethylene terephthalate, polyethylene naphthalate), polycarbonate resins, polyolefin resins, polyvinyl resins (e.g., polyvinyl chloride, polyvinylidene chloride, polyvinyl acetals, etc.), cellulose ester bases (e.g., cellulose triacetate, cellulose acetate), and other conventional polymeric films used as supports. For making OELs on plastic substrates, it is often desirable to include a barrier film or coating on one or both surfaces of the plastic substrate to protect the organic light emitting devices and their electrodes from exposure to undesired levels of water, oxygen, and the like.

Receptor substrates can be pre-patterned with any one or more of electrodes, transistors, capacitors, insulator ribs, spacers, color filters, black matrix, hole transport layers, electron transport layers, and other elements useful for electronic displays or other devices.

Figure 3:
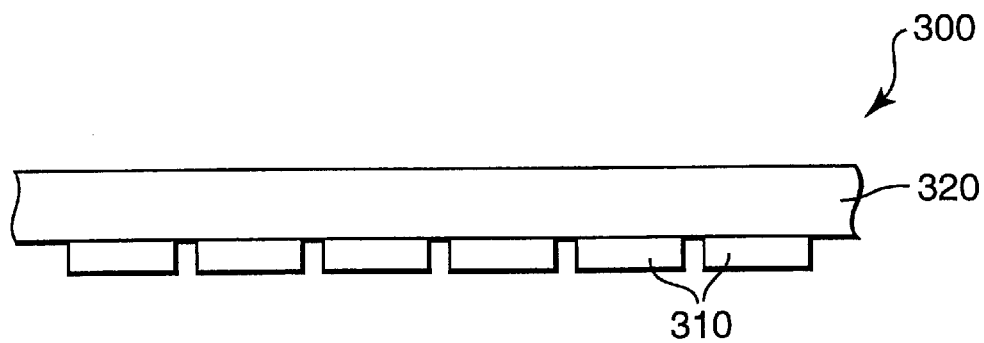
FIG. 3 is a schematic side view of an organic electroluminescent display according to the present invention.
Figure 4A:
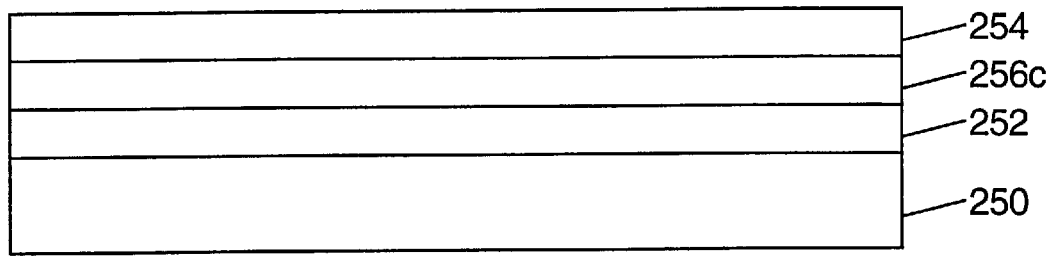
FIG. 4A is a schematic side view of a first embodiment of an organic electroluminescent device.
Figure 4B:
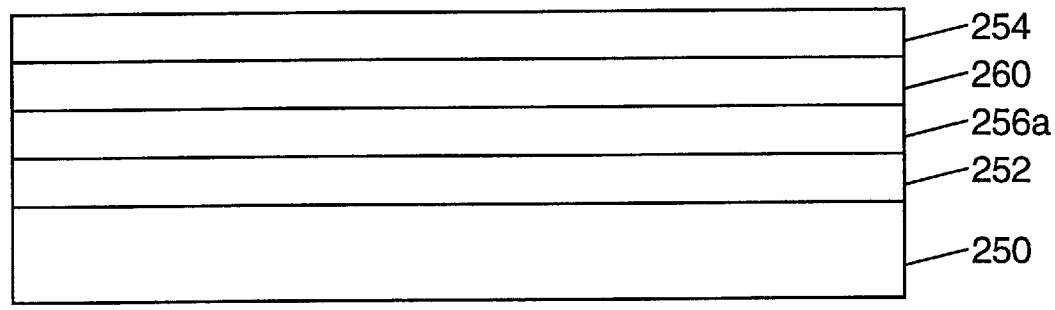
FIG. 4B is a schematic side view of a second embodiment of an organic electroluminescent device.
Figure 4C:
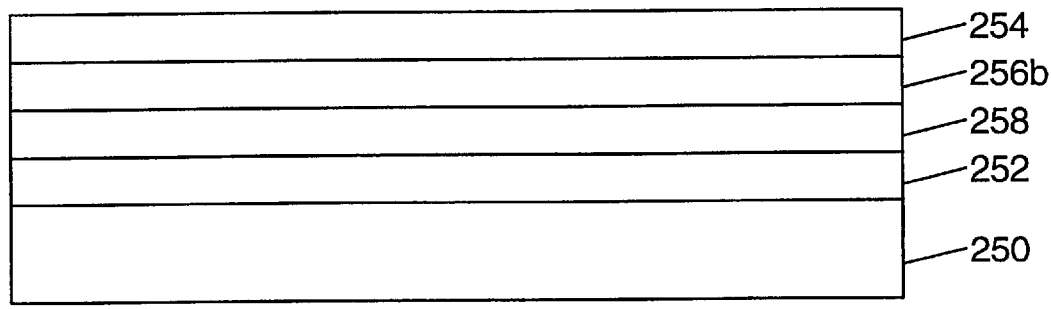
FIG. 4C is a schematic side view of a third embodiment of an organic electroluminescent device.
Figure 4D:
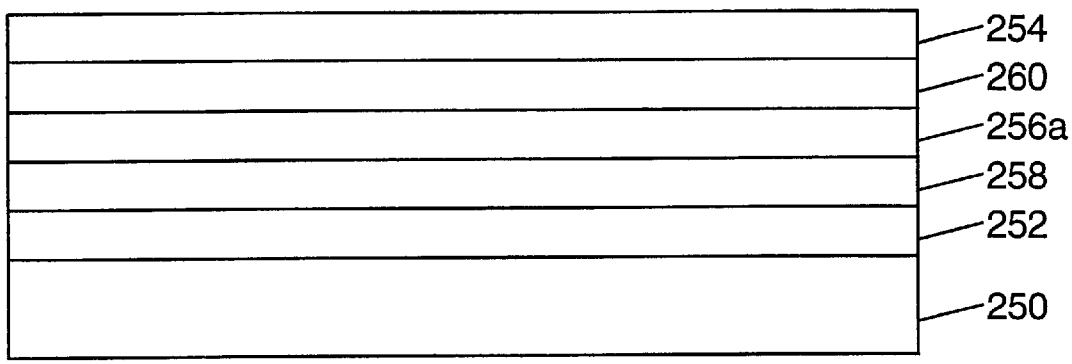
FIG. 4D is a schematic side view of a fourth embodiment of an organic electroluminescent device.
Figure 4E:
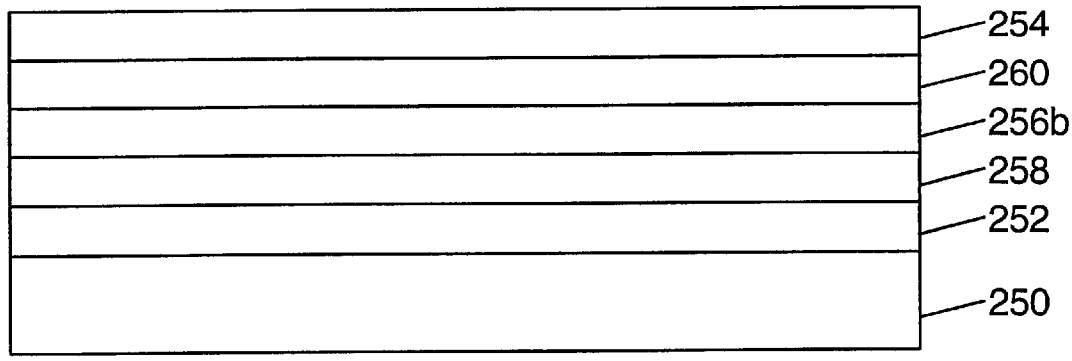
FIG. 4E is a schematic side view of a fifth embodiment of an organic electroluminescent device.
Figure 4F:
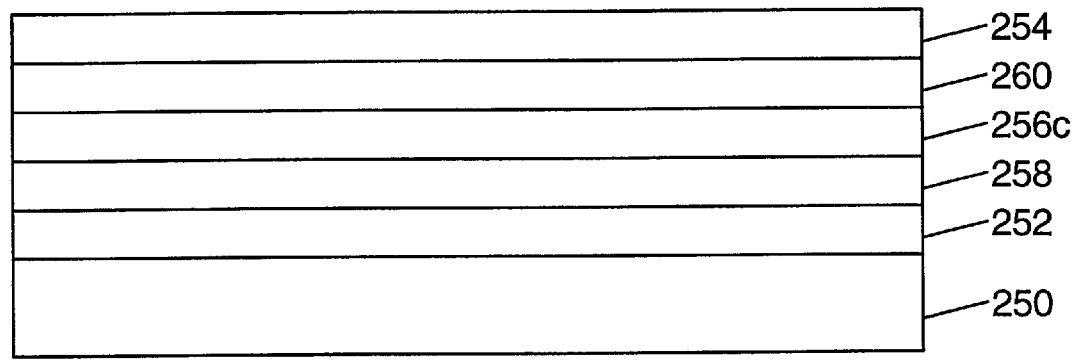
FIG. 4F is a schematic side view of a sixth embodiment of an organic electroluminescent device.

The present invention contemplates polarized light emitting OEL displays and devices. In one embodiment, OEL displays can be made that emit light and that have adjacent devices that can emit light having different color. For example, FIG. 3 shows an OEL display 300 that includes a plurality of OEL devices 310 disposed on a substrate 320. Adjacent devices 310 can be made to emit different colors of light.

The separation shown between devices 310 is for illustrative purposes only. Adjacent devices may be separated, in contact, overlapping, etc., or different combinations of these in more than one direction on the display substrate. For example, a pattern of parallel striped transparent conductive anodes can be formed on the substrate followed by a striped pattern of a hole transport material and a striped repeating pattern of red, green, and blue light emitting LEP layers, followed by a striped pattern of cathodes, the cathode stripes oriented perpendicular to the anode stripes. Such a construction may be suitable for forming passive matrix displays. In other embodiments, transparent conductive anode pads can be provided in a two-dimensional pattern on the substrate and associated with addressing electronics such as one or more transistors, capacitors, etc., such as are suitable for making active matrix displays. Other layers, including the light emitting layer(s) can then be coated or deposited as a single layer or can be patterned (e.g., parallel stripes, two-dimensional pattern commensurate with the anodes, etc.) over the anodes or electronic devices. Any other suitable construction is also contemplated by the present invention.

In one embodiment, display 300 can be a multiple color display. As such, it may be desirable to position optional polarizer 330 between the light emitting devices and a viewer, for example to enhance the contrast of the display. In exemplary embodiments, each of the devices 310 emits light. There are many displays and devices constructions covered by the general construction illustrated in FIG. 3. Some of those constructions are discussed as follows.

OEL backlights can include emissive layers. Constructions can include bare or circuitized substrates, anodes, cathodes, hole transport layers, electron transport layers, hole injection layers, electron injection layers, emissive layers, color changing layers, and other layers and materials suitable in OEL devices. Constructions can also include polarizers, diffusers, light guides, lenses, light control films, brightness enhancement films, and the like. Applications include white or single color large area single pixel lamps, for example where an emissive material is provided by thermal stamp transfer, lamination transfer, resistive head thermal printing, or the like; white or single color large area single electrode pair lamps that have a large number of closely spaced emissive layers patterned by laser induced thermal transfer; and tunable color multiple electrode large area lamps.

Low resolution OEL displays can include emissive layers. Constructions can include bare or circuitized substrates, anodes, cathodes, hole transport layers, electron transport layers, hole injection layers, electron injection layers, emissive layers, color changing layers, and other layers and materials suitable in OEL devices. Constructions can also include polarizers, diffusers, light guides, lenses, light control films, brightness enhancement films, and the like. Applications include graphic indicator lamps (e.g., icons); segmented alphanumeric displays (e.g., appliance time indicators); small monochrome passive or active matrix displays; small monochrome passive or active matrix displays plus graphic indicator lamps as part of an integrated display (e.g., cell phone displays); large area pixel display tiles (e.g., a plurality of modules, or tiles, each having a relatively small number of pixels), such as may be suitable for outdoor display used; and security display applications.

High resolution OEL displays can include emissive layers. Constructions can include bare or circuitized substrates, anodes, cathodes, hole transport layers, electron transport layers, hole injection layers, electron injection layers, emissive layers, color changing layers, and other layers and materials suitable in OEL devices. Constructions can also include polarizers, diffusers, light guides, lenses, light control films, brightness enhancement films, and the like. Applications include active or passive matrix multicolor or full color displays; active or passive matrix multicolor or full color displays plus segmented or graphic indicator lamps (e.g., laser induced transfer of high resolution devices plus thermal hot stamp of icons on the same substrate); and security display applications.

EXAMPLES

Example 1

Preparation of a Receptors

Three different types of receptors were formed: (A) indium tin oxide (ITO) only; (B) PDOT (poly(3,4-ethylenedioxythiophene)) on ITO; and (C) mTDATA (4,4', 4"-tris(N-($^3$-methylphenyl)-N-phenylamino) triphenylamine) on PDOT/ITO. To obtain receptor surface (A), ITO glass (Delta Technologies, Stillwater, Minn., sheet resistance less than 100 Ω/square, 1.1 mm thick) was ultrasonically cleaned in a hot, 3% solution of Deconex 12NS (Borer Chemie AG, Zuchwil Switzerland). The substrates were then placed in the Plasma Science Model PS0500 plasma treater (4th State Inc., Belmont, Calif.) for surface treatment under the following conditions:

| Time: | 2 minutes |
| Power: | 500 watt (165 W/cm$^2$) |
| Oxygen Flow: | 100 sccm |

To obtain receptor surface (B), the ITO was cleaned and plasma-treated as described for the preparation of receptor surface (A). Immediately after plasma treatment, the PDOT solution (CH-8000 from Bayer AG, Leverkusen, Germany, diluted 1:1 with deionized water) was filtered and dispensed through a Whatman Puradisc™ 0.45 μm Polypropylene (PP) syringe filter onto the ITO substrate. The substrate was then spun (Headway Research spincoater) at 2000 rpm for 30 s yielding a PDOT film thickness of 40 nm. All of the substrates were heated to 200° C. for 5 minutes under nitrogen.

To obtain receptor surface (C), a PDOT film was deposited onto ITO as described for the preparation of receptor surface (B). After the substrates had cooled, a solution of mTDATA (OSA 3939, H. W. Sands Corp., Jupiter, Fla.) 2.5% (w/w) in toluene was filtered and dispensed through a Whatman Puradisc™ 0.45 μm Polypropylene (PP) syringe filter onto the PDOT coated ITO substrate. The substrate was spun (Headway Research spincoater) at 3000 rpm for 30 s yielding an mTDATA film thickness of 40 nm.

Example 2

Preparation of a Donor Sheet without Transfer Layer

A thermal transfer donor sheet was prepared in the following manner.

An LTHC solution, given in Table I, was coated onto a 0.1 mm thick polyethylene terapthalate (PET) film substrate from Teijin (Osaka, Japan). Coating was performed using a Yasui Seiki Lab Coater, Model CAG-150, using a microgravure roll with 150 helical cells per lineal inch. The LTHC coating was in-line dried at 80° C. and cured under ultraviolet (UV) radiation.

TABLE I

LTHC Coating Solution

| Component | Trade Designation | Parts by Weight |
|---|---|---|
| carbon black pigment | Raven 760 Ultra [1] | 3.55 |
| polyvinyl butyral resin | Butvar B-98 [2] | 0.63 |
| acrylic resin | Joncryl 67 [3] | 1.90 |
| dispersant | Disperbyk 161 [4] | 0.32 |
| surfactant | FC-430 [5] | 0.01 |
| epoxy novolac acrylate | Ebecryl 629 [6] | 12.09 |
| acrylic resin | Elvacite 2669 [7] | 8.06 |
| 2-benzyl-2-(dimethylamino)-1-(4-(morpholinyl) phenyl) butanone | Irgacure 369 [8] | 0.82 |
| 1-hydroxycyclohexyl phenyl ketone | Irgacure 184 [8] | 0.12 |
| 2-butanone | | 45.31 |
| 1,2-propanediol monomethyl ether acetate | | 27.19 |

[1] available from Columbian Chemicals Co., Atlanta, GA
[2] available from Solutia Inc., St. Louis, MO
[3] available from S. C. Johnson & Son, Inc., Racine, WI
[4] available from Byk-Chemie USA, Wallingford, CT
[5] available from Minnesota Mining and Manufacturing Co., St. Paul, MN
[6] available from UCB Radcure Inc., N. Augusta, SC
[7] available from ICI Acrylics Inc., Memphis, TN
[8] available from Ciba-Geigy Corp., Tarrytown, NY Next, an interlayer, given in Table II, was coated onto the cured LTHC layer by a rotogravure coating method using the Yasui Seiki Lab Coater, Model CAG-150, with a microgravure roll having 180 helical cells per lineal inch. This coating was in-line dried at 60° C. and UV cured.

TABLE II

Interlayer Coating Solution

| Component | Parts by Weight |
| --- | --- |
| SR 351 HP (trimethylolpropane triacrylate ester, available from Sartomer, Exton, PA) | 14.85 |
| Butvar B-98 | 0.93 |
| Joncryl 67 | 2.78 |
| Irgacure 369 | 1.25 |
| Irgacure 184 | 0.19 |
| 2-butanone | 48.00 |
| 1-methoxy-2-propanol | 32.00 |

Example 3

Preparation of Solutions for Transfer Layer

The following solutions were prepared:

(a) Covion green. Covion Green PPV Polymer HB 1270 (100 mg) from Covion Organic Semiconductors GmbH, Frankfurt, Germany was weighed out into an amber vial with a PTFE cap. To this was added 9.9 g of Toluene (HPLC grade obtained from Aldrich Chemical, Milwaukee, Wis.). The vial containing the solution was placed into a silicone oil bath at 75° C. for 60 minutes. The hot solution was filtered through a 0.45 μm Polypropylene (PP) syringe filter.

(b) Covion super yellow. Covion PDY 132 "Super Yellow" (75 mg) was weighed out into an amber vial with a PTFE cap. To this was added 9.925 g of Toluene (HPLC grade obtained from Aldrich Chemicals) and a stir bar. The solution was stirred overnight. The solution was filtered through a 5 μm Millipore Millex syringe filter.

(c) mTDATA. Into a container was weighed out 100 mg mTDATA (OSA 3939 available from H. W. Sands Corp, Jupiter, Fla.). To this was added 3.9 g of Toluene (HPLC grade obtained from Aldrich Chemical; Milwaukee, Wis.). The solution was heated at 75° C. while stirring in silicone oil bath for 25 minutes. The hot solution was filtered through a Whatman Puradisc™ 0.45 μm Polypropylene (PP) filter.

(d) t-Butyl PBD. Into a container was weighted out 100 mg t-butyl PBD (2-(biphenyl-4-yl)-5-(4-(1,1-dimethylethyl)phenyl)-1,3,4-oxadiazole, available from Aldrich Chemical Co., Milwaukee, Wis.). To this was added 3.9 g of Toluene (HPLC grade obtained from Aldrich Chemicals). The solution was stirred for 25 minutes and filtered through a Whatman Puradisc™ 0.45 μm Polypropylene (PP) filter.

Examples 4–8

Preparation of Transfer Layers on Donor Sheet and Transfer of Transfer Layers Transfer Layers were formed on the donor sheets of Example 2 using blends of the Solutions of Example 3 according to Table III. To obtain the blends, the above described solutions were mixed at the appropriate ratios and the resulting blend solutions were stirred for 20 min at room temperature.

The transfer layers were disposed on the donor sheets by spinning (Headway Research spincoater) at about 2000 rpm for 30 s to yield a film thickness of approximately 100 nm.

TABLE III

Parts by Weight of Transfer Layer Compositions

| Example No. | Covion Green | Covion Super Yellow | mTDATA | t-butyl PBD |
| --- | --- | --- | --- | --- |
| 4 | 1 | — | — | 2 |
| 5 | 2 | — | — | 5 |
| 6 | 1 | — | — | 3 |
| 7 | 1 | — | 1 | 1 |
| 8 | — | 1 | 3 | — |

Donor sheets as prepared in Examples 4–8 were brought into contact with receptor substrates as prepared in Example 1. Next, the donors were imaged using two single-mode Nd:YAG lasers. Scanning was performed using a system of linear galvanometers, with the combined laser beams focused onto the image plane using an f-theta scan lens as part of a near-telecentric configuration. The laser energy density was 0.4 to 0.8 J/cm$^2$. The laser spot size, measured at the 1/e$^2$ intensity, was 30 micrometers by 350 micrometers. The linear laser spot velocity was adjustable between 10 and 30 meters per second, measured at the image plane. The laser spot was dithered perpendicular to the major displacement direction with about a 100 μm amplitude. The transfer layers were transferred as lines onto the receptor substrates, and the intended width of the lines was about 100 μm.

The transfer layers were transferred in a series of lines that were in overlying registry with the ITO stripes on the receptor substrates. The results of imaging are given in Table IV.

TABLE IV

Results of Transfer

| Example No. | Substrate (A) ITO | Substrate (B) ITO/PDOT | Substrate (C) ITO/PDOT/mTDATA |
| --- | --- | --- | --- |
| 4 | excellent transfer; excellent edge quality | spotty transfer, no continuous lines | excellent transfer; good edge quality |
| 5 | excellent transfer; excellent edge quality | spotty transfer, no continuous lines | excellent transfer; good edge quality |
| 6 | excellent transfer; excellent edge quality | spotty transfer, no continuous lines | excellent transfer; good edge quality |
| 7 | excellent transfer; excellent edge quality | good transfer; good edge quality | excellent transfer; excellent edge quality |
| 8 | excellent transfer at high laser dose; excellent edge quality at high laser dose | good transfer with some hole defects; excellent edge quality | excellent transfer; excellent edge quality |

Example 9

Preparation of OEL Devices

The three transfer layer compositions of Examples 4–6 were used to prepare light-emitting diodes of the construction ITO/PDOT/mTDATA/Transfer Layer/Ca/Ag. After transfer of the transfer layer as described in Examples 4–6, Ca/Ag cathodes were vacuum vapor deposited using the following conditions:

|    | Thickness | Rate   | Coating time |
|----|-----------|--------|--------------|
| Ca | 400 Å     | 1.1 Å/s | 5 min 51 s  |
| Ag | 4000 Å    | 5.0 Å/s | 13 min 20 s |

In all cases diode behavior and green light emission were observed.

The present invention should not be considered limited to the particular examples described above, but rather should be understood to cover all aspects of the invention as fairly set out in the attached claims. Various modifications, equivalent processes, as well as numerous structures to which the present invention may be applicable will be readily apparent to those of skill in the art to which the present invention is directed upon review of the instant specification.

Each of the patents, patent documents, and publications cited above is hereby incorporated into this document as if reproduced in full.

What is claimed is:

1. An electroluminescent device, comprising:

a first electrode;

a second electrode; and a light emitting layer disposed between the first and second electrodes, the light emitting layer comprising an amorphous, non-polymeric organic matrix with a light emitting polymer disposed in the matrix.

2. The electroluminescent device of claim 1, wherein the matrix comprises at least one amorphous, non-polymeric, organic compound selected from

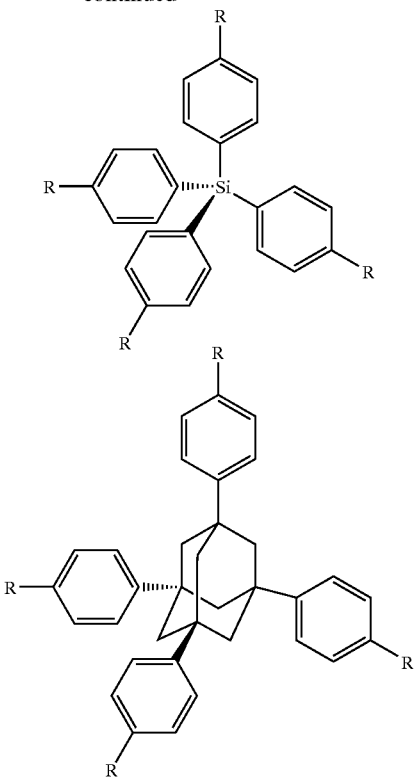

wherein each R is independently a substituent comprising at least one functional group selected from alkenyl, alkenylene, aryl, arylene, heteroaryl, and heteroarylene.

3. The electroluminescent device of claim 1, wherein the matrix comprises at least one amorphous, non-polymeric, organic dendrimer.

4. The electroluminescent device of claim 1, wherein the matrix comprises an amorphous, non-polymeric, organic spiro compound.

5. The electroluminescent device of claim 1, wherein the amorphous, non-polymeric, organic matrix comprises a hole transport material.

6. The electroluminescent device of claim 1, wherein the amorphous, non-polymeric organic matrix comprises an electron transport material.

7. The electroluminescent device of claim 1, wherein a hole transport material or electron transport material is also disposed within the amorphous, non-polymeric organic matrix.

* * * * *

UNITED STATES PATENT AND TRADEMARK OFFICE
CERTIFICATE OF CORRECTION

PATENT NO. : 6,699,597 B2
DATED : March 2, 2004
INVENTOR(S) : Erika Bellmann

It is certified that error appears in the above-identified patent and that said Letters Patent is hereby corrected as shown below:

Title page,
Item [56], References Cited, OTHER PUBLICATIONS, "Fujikawa et al.," reference, delete "triphyenylamine" and insert therefore -- triphenylamine --; "Kraft et al.," reference, delete "Polymers-13 Seeing" and insert therefore -- Polymers-Seeing --; "Tanaka et al.," reference, delete "phyenylene" and insert therefore -- phenylene --.

Column 35,
Line 50, "N-($^3$-methylphenyl)" and insert therefore -- (N-(3-methylphenyl) --.

Signed and Sealed this

Twenty-first Day of September, 2004

JON W. DUDAS
*Director of the United States Patent and Trademark Office*